(12) United States Patent
Hagihara

(10) Patent No.: US 8,625,015 B2
(45) Date of Patent: Jan. 7, 2014

(54) AD CONVERSION CIRCUIT AND SOLID-STATE IMAGING APPARATUS

(75) Inventor: Yoshio Hagihara, Tokyo (JP)

(73) Assignee: Olympus Corporation, Tokyo (JP)

( * ) Notice: Subject to any disclaimer, the term of this patent is extended or adjusted under 35 U.S.C. 154(b) by 12 days.

(21) Appl. No.: 13/523,214

(22) Filed: Jun. 14, 2012

(65) Prior Publication Data

US 2012/0320244 A1 Dec. 20, 2012

(30) Foreign Application Priority Data

Jun. 14, 2011 (JP) ................................. 2011-132197

(51) Int. Cl.
H04N 3/14 (2006.01)
H04N 5/335 (2011.01)
H03M 1/12 (2006.01)
H01L 27/00 (2006.01)

(52) U.S. Cl.
USPC ......... 348/302; 348/308; 341/155; 250/208.1

(58) Field of Classification Search
USPC ........ 348/300–308; 341/155, 157; 250/208.1, 250/214.1
See application file for complete search history.

(56) References Cited

U.S. PATENT DOCUMENTS

| | | | |
|---|---|---|---|
| 2005/0231624 A1* | 10/2005 | Muramatsu et al. | 348/311 |
| 2007/0019091 A1* | 1/2007 | Muramatsu et al. | 348/308 |
| 2007/0024728 A1* | 2/2007 | Muramatsu et al. | 348/308 |
| 2007/0024729 A1* | 2/2007 | Muramatsu et al. | 348/308 |
| 2007/0024730 A1* | 2/2007 | Muramatsu et al. | 348/308 |
| 2007/0024731 A1* | 2/2007 | Muramatsu et al. | 348/308 |
| 2009/0040352 A1* | 2/2009 | Kawaguchi | 348/308 |
| 2009/0231479 A1* | 9/2009 | Zarnowski et al. | 348/302 |
| 2010/0271525 A1* | 10/2010 | Takahashi | 348/308 |
| 2011/0074994 A1* | 3/2011 | Wakabayashi et al. | 348/302 |

OTHER PUBLICATIONS

Toyama, Takayuki et al., "A 17.7M pixel 120fps CMOS Image Sensor with 34.8Gb/s Readout", ISSCC2011/SESSION23/IMAGE SENSORS/23.11, p. 420-421.

* cited by examiner

*Primary Examiner* — Kelly L Jerabek
(74) *Attorney, Agent, or Firm* — Westerman, Hattori, Daniels & Adrian, LLP

(57) ABSTRACT

A comparison section includes an analog signal to be subjected to AD conversion to a reference signal that increases or decreases with the passage of time, and terminates a comparison process at a timing at which the reference signal has satisfied a predetermined condition for the analog signal. A first count section counts a clock signal of a predetermined frequency as a count clock and outputs a count value. A latch section latches the count value output from the first count section. A latch control section enables the latch section at a first timing related to an end of the comparison process and causes the latch section to execute a latch operation at a second timing delayed by a predetermined time from the first timing.

6 Claims, 15 Drawing Sheets

AD CONVERSION CIRCUIT AND SOLID-STATE IMAGING APPARATUS

Priority is claimed on Japanese Patent Application No. 2011-132197, filed on Jun. 14, 2011, the content of which is incorporated herein by reference.

BACKGROUND OF INVENTION

1. Field of Invention

The present invention relates to an analog-to-digital (AD) conversion circuit and a solid-state imaging apparatus having the same.

2. Description of Related Art

As an example of an AD conversion circuit according to the related art, a configuration shown in FIG. 14 is well known (for example, see Takayuki Toyama et al., "A 17.7 Mpixel 120 fps CMOS Image Sensor with 34.8 Gb/s Readout," Sony, Kanagawa, Japan ISSCC2011/SESSION23/IMAGE SENSORS/23.11). First, the configuration and operation of the AD conversion circuit of FIG. 14 will be described.

FIG. 14 shows a configuration of a single-slope AD conversion circuit according to the related art. The AD conversion circuit shown in FIG. 14 includes a first count section 1018, a second count section 1101, a latch section 1108, a comparison section 1109, and a buffer circuit BUF.

The first count section 1018 counts a clock signal CLK having a predetermined frequency as a count clock, and outputs binary count values D0 to D4. The comparison section 1109 has a voltage comparator COMP into which an analog signal Signal and a ramp wave Ramp are input. The analog signal Signal serves as an AD conversion target. The ramp wave Ramp decreases with the passage of time. The comparison section 1109 outputs a comparison output CO based on a result obtained by comparing the analog signal Signal to the ramp wave Ramp. In the comparison section 1109, a time interval (the magnitude of a time axis direction) corresponding to the analog signal Signal is generated.

The latch section 1108 latches logical states of the count values D0 to D4 output from the first count section 1018. In this example, the latch section 1108 includes latch circuits D_0 to D_4 of 5 bits. The count values D0 to D4 are input from the first count section 1018 to the latch circuits D_0 to D_4. The second count section 1101 counts an output Q4 of the latch circuit D_4 to which the count value D4 corresponding to a most significant bit (MSB) among the count values D0 to D4 output from the first count section 1018 is input as a count clock. In this example, the second count section 1101 includes a 7-bit counter circuit (not illustrated). The buffer circuit BUF is an inverting buffer circuit that inverts an input signal and outputs the inverted signal. Herein, a configuration of the inverting buffer circuit is used in order to facilitate the understanding of embodiments of the present invention as will be described later.

FIG. 15 shows an operation of the AD conversion circuit shown in FIG. 14. Hereinafter, the operation of the AD conversion circuit according to the related art will be described.

First, after an input of the analog signal Signal to be subjected to AD conversion has been stabilized, the ramp wave Ramp, which decreases with the passage of time, the ramp wave Ramp is input to one input terminal of the comparator 1109. The comparator 1109 compares the ramp wave Ramp to the analog signal Signal. Meanwhile, the first count section 1018 counts the clock signal CLK, for example, in a count-up mode, and outputs the count values D0 to D4. In addition, the second count section 1101 counts the output Q4 of the latch circuit D_4 of the latch section 1108.

The comparison section 1109 compares the ramp wave Ramp to the analog signal Signal, and inverts the comparison output CO at a timing at which voltages of the ramp wave Ramp and the analog signal Signal have been approximately consistent (a first timing). After the comparison output CO has been buffered by the buffer circuit BUF, a latch signal Hold is output from the buffer circuit BUF (a second timing). On the basis of the latch signal Hold, the latch circuits D_0 to D_4 of the latch section 1108 are in a disable state, so that logical states corresponding to the count values D0 to D4 are latched in the latch circuits D_0 to D_4 of the latch section 1108. When the latch circuit D_4 of the latch section 1108 is stopped, the second count section 1101 latches count values D5 to D11 at that time. Thereby, digital data DOUT[11:0] corresponding to the analog signal Signal is obtained.

In the AD conversion circuit of the related art described above, because the latch circuits D_0 to D_3 constituting the latch section 1108 continuously operate during a period of a time interval, a value of current consumed by the latch section 1108 increases.

In the AD conversion circuit of the related art, the latch circuits D_0 to D_3 constituting the latch section 1108 constantly operate in a period from a start time of a comparison by the comparison section 1109 to the second timing. In general, because an output (particularly, a count value D0 of a least significant bit (LSB)) from the first count section 1018 has a high frequency, current consumed by the latch circuits D_0 to D_3 constituting the latch section 1108 is high.

Here, an imager used in a digital still camera (DSC) or the like is considered as a specific example using the AD conversion circuit of the related art. Specifically, specs in which the number of pixels is $2000 \times 10^4$ and a frame rate is 120 frames/sec are assumed. Assuming that an AD conversion circuit is arranged for each column of a pixel array, a pixel array of $2000 \times 10^4$ pixels is designated as 4000 rows×5000 columns in length and width in order to facilitate description and a blanking period is absent for further simplicity, the number of rows from which pixel signals are read per second is as follows.

120 frames/sec×4000 rows/frame=480K lines/sec

That is, a read rate of one row becomes 480 KHz. For example, for 10-bit resolution AD conversion, a count value is output from the first count section 1018 at a frequency of about 480 MHz, which is 1024 times greater than the read rate of one row. Further, for example, for 12-bit resolution AD conversion, a count value is output from the first count section 1018 at a frequency of about 2 GHz, which is 4096 times greater than the read rate of one row. In this case, assuming that a consumption current value of the latch circuits D_0 to D_3 constituting the latch section 1108 is 100 μA/column, a consumed current value for 5000 columns becomes as follows.

100 μA/column×5000 columns=500 mA

Further, if the number of pixels, a frame rate, and resolution increase, a count value is output at a frequency of more than 2 GHz, which is a frequency estimated as described above, and the consumption current further increases.

SUMMARY OF INVENTION

According to a first aspect of the present invention, an AD conversion circuit includes a reference signal generation section configured to generate a reference signal that increases or decreases with the passage of time, a comparison section configured to compare an analog signal to be subjected to AD conversion to the reference signal and configured to terminate a comparison process at a timing at which the reference signal has satisfied a predetermined condition for the analog signal, a first count section configured to count a clock signal of a predetermined frequency as a count clock and outputting a count value, a latch section configured to latch the count value output from the first count section, and a latch control section configured to enable the latch section at a first timing related to an end of the comparison process and configured to cause the latch section to execute a latch operation at a second timing delayed by a predetermined time from the first timing. The AD conversion circuit outputs digital data corresponding to the analog signal on the basis of the count value latched in the latch section.

According to a second aspect of the present invention, an AD conversion circuit includes a reference signal generation section configured to generate a reference signal that increases or decreases with the passage of time, a comparison section configured to compare an analog signal to be subjected to AD conversion to the reference signal and configured to terminate a comparison process at a timing at which the reference signal has satisfied a predetermined condition for the analog signal, a first count section configured to count a clock signal of a predetermined frequency as a count clock and outputting a first count value, a latch section configured to latch the first count value output from the first count section, a second count section configured to cause one of bits constituting the first count value output from the first count section as a count clock and latching a second count value, and a latch control section configured to enable the latch section at a first timing related to an end of the comparison process and configured to cause the latch section and the second count section to execute latch operations at a second timing delayed by a predetermined time from the first timing. The AD conversion circuit outputs digital data corresponding to the analog signal on the basis of the first count value latched in the latch section and the second count values latched in the second count section.

Preferably, the second timing is a timing synchronized with the clock signal.

According to a third aspect of the present invention, a solid-state imaging apparatus includes an imaging section in which a plurality of pixels are each arranged in a matrix to output a pixel signal according to the amount of an incident electromagnetic wave, and the AD conversion circuit. In the solid-state imaging apparatus, the pixel signal is input to the AD conversion circuit as the analog signal. The comparison section, the latch section, and the latch control section are provided for every column or every plurality of columns of the image section.

According to a fourth aspect of the present invention, a solid-state imaging apparatus includes an imaging section in which a plurality of pixels are each arranged in a matrix to output a pixel signal according to the amount of an incident electromagnetic wave, and the AD conversion circuit. The pixel signal is input to the AD conversion circuit as the analog signal. The comparison section, the latch section, the second count section, and the latch control section are provided for every column or every plurality of columns of the image section.

DETAILED DESCRIPTION OF INVENTION

Hereinafter, embodiments of the present invention will be described with reference to the drawings.

First Embodiment

Figure 1:
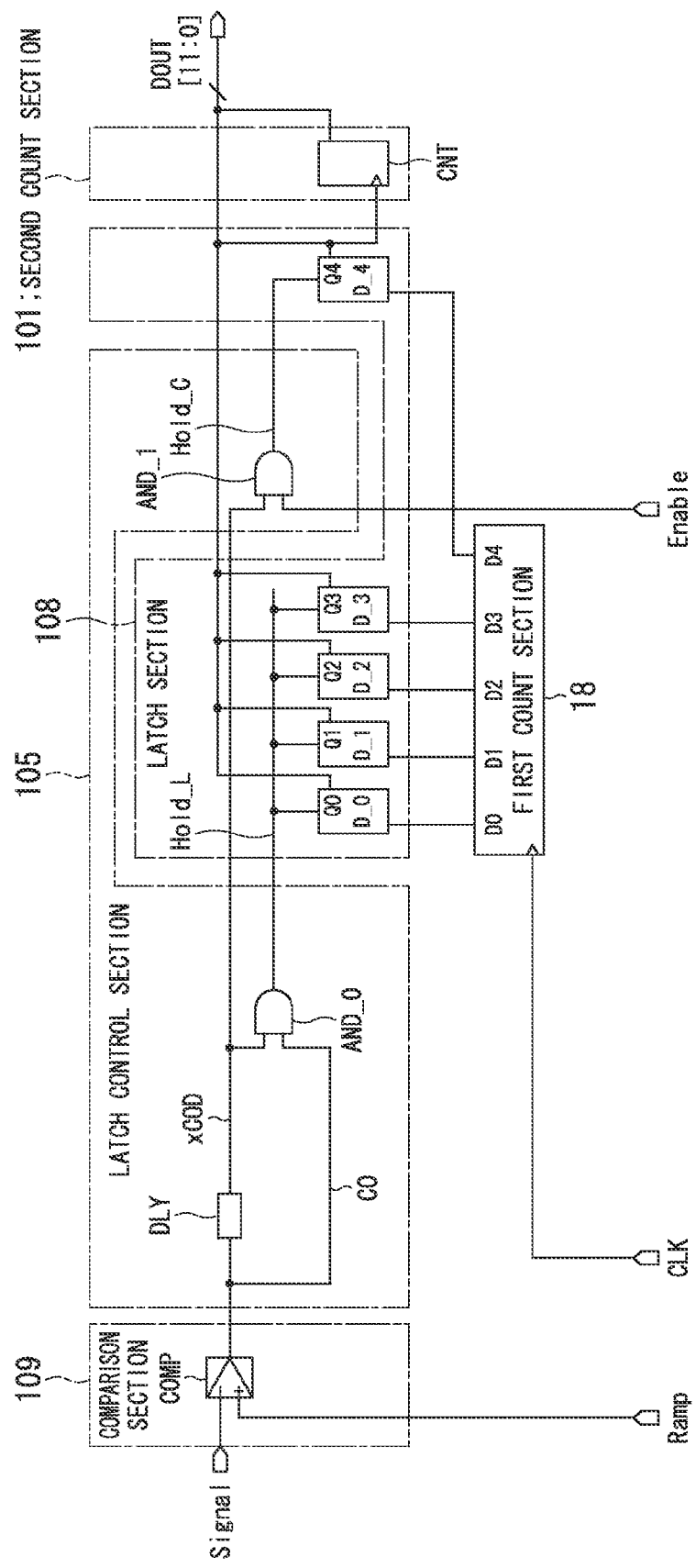
FIG. 1 is a circuit diagram showing a configuration of an AD conversion circuit according to a first embodiment of the present invention.

First, the first embodiment of the present invention will be described. FIG. 1 shows an example of a configuration of an AD conversion circuit according to the present embodiment. The AD conversion circuit shown in FIG. 1 includes a first count section 18, a second count section 101, a latch control section 105, a latch section 108, and a comparison section 109.

The first count section 18 counts a clock signal CLK having a predetermined frequency as a count clock, and outputs binary count values D0 to D4. The comparison section 109 has a voltage comparator COMP into which an analog signal Signal and a ramp wave Ramp are input. The analog signal Signal serves as an AD conversion target. The ramp wave Ramp decreases with the passage of time. The comparison section 109 outputs a comparison output CO based on a result obtained by comparing the analog signal Signal to the ramp wave Ramp.

The latch section 108 latches logical states of the count values D0 to D4 output from the first count section 18. In the present embodiment, the latch section 108 includes latch circuits D_0 to D_4 of 5 bits. The count values D0 to D4 are input from the first count section 18 to the latch circuits D_0 to D_4. The second count section 101 has a counter circuit CNT that counts an output Q4 of the latch circuit D_4 to which the count value D4 corresponding to an MSB among the count values D0 to D4 output from the first count section 18 is input as a count clock. In the present embodiment, the counter circuit CNT includes a 7-bit counter circuit.

Figure 2:
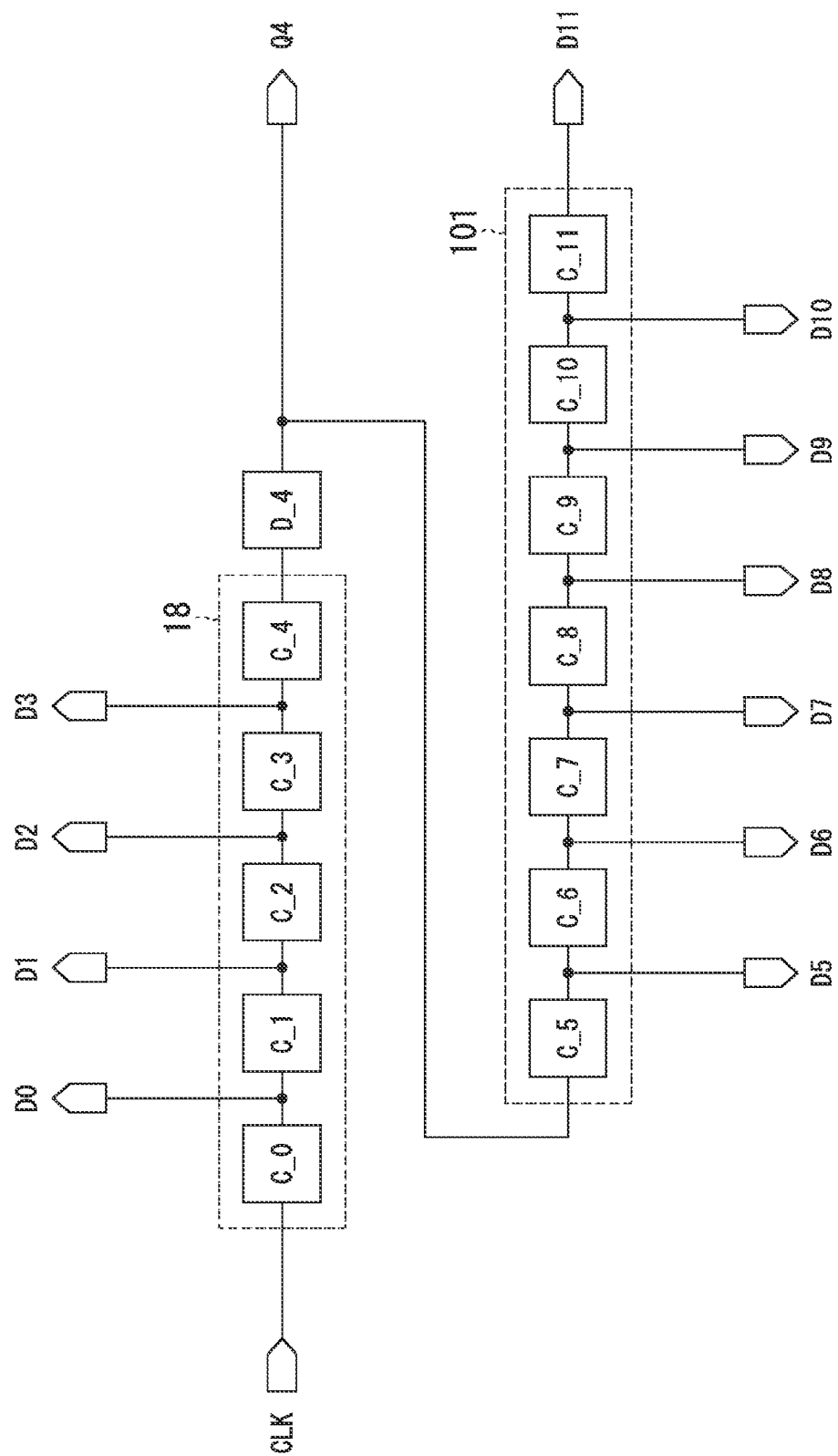
FIG. 2 is a block diagram showing configurations of first and second count sections provided in the AD conversion circuit according to the first embodiment of the present invention.

FIG. 2 shows configurations of counter circuits including the first count section 18 and the second count section 101. As shown in FIG. 2, the first count section 18 has counter circuits C_0 to C_4 that output the count values D0 to D4 constituting less significant bits of digital data. The count values D0 to D3 of the counter circuits C_0 to C_3 are output to the latch circuits D_0 to D_3 of the latch section 108. The count value D4 of the counter circuit C_4 is output to the latch circuit D_4 of the latch section 108, and the output Q4 of the latch circuit D_4 is further output to the second count section 101. The second count section 101 has counter circuits C_5 to C_11 that output count values D5 to D11 constituting more significant bits of the digital data. Here, the counter circuits C_5 to C_11 are assumed to be binary counter circuits each having a latch function of holding a logical state.

The latch control section 105 generates a control signal for controlling an operation of the latch section 108. The latch control section 105 includes an inverting delay circuit DLY, AND circuit AND_0 and AND circuit AND_1. The comparison output CO from the comparison section 109 is input to the inverting delay circuit DLY. The inverting delay circuit DLY inverts and delays the comparison output CO, and outputs a delayed comparison output xCOD. The comparison output CO from the comparison section 109 and the delayed comparison output xCOD from the inverting delay circuit DLY are input to the AND circuit AND_0. The AND circuit AND_0 outputs a control signal Hold_L by carrying out a logical AND operation on the comparison output CO and the delayed comparison output xCOD. A control signal Enable and the delayed comparison output xCOD from the inverting delay circuit DLY are input to the AND circuit AND_1. The AND circuit AND_1 outputs a control signal Hold_C by carrying out a logical AND operation on the control signal Enable and the delayed comparison output xCOD.

Although details will be described later, the latch control section 105 enables the latch circuit D_4 of the latch section 108 at a comparison process start time in the comparison section 109 according to the above-described configuration. Thereafter, the latch circuits D_0 to D_3 of the latch section 108 are enabled at a first timing at which the comparison output CO is inverted. Further, the latch control section 105 causes the latch circuits D_0 to D_4 of the latch section 108 to execute latch operations at a second timing delayed by a predetermined time from the first timing.

When the control signal Hold_L from the AND circuit AND_0 of the latch control section 105 is high, the latch circuits D_0 to D_3 of the latch section 108 are in an enable state and directly output the count values D0 to D3 from the first count section 18. In addition, the latch circuits D_0 to D_3 are in a disable state when the control signal Hold_L from the AND circuit AND_0 of the latch control section 105 transitions from a high level to a low level. At this time, the latch circuits D_0 to D_3 latch logical states corresponding to the count values D0 to D3 from the first count section 18.

On the other hand, when the control signal Hold_C from the AND circuit AND_1 of the latch control section 105 is high, the latch circuit D_4 of the latch section 108 is in the enable state and directly outputs the count value D4 from the first count section 18. In addition, the latch circuit D_4 of the latch section 108 is in the disable state when the control signal Hold_C from the AND circuit AND_1 of the latch control section 105 transitions from the high level to the low level. At this time, the latch circuit D_4 latches a logical state corresponding to the count value D4 from the first count section 18.

The above-described configuration is an example, and it is possible to appropriately change the number of bits of a counter circuit constituting the first count section 18 or the second count section 101.

Figure 3:
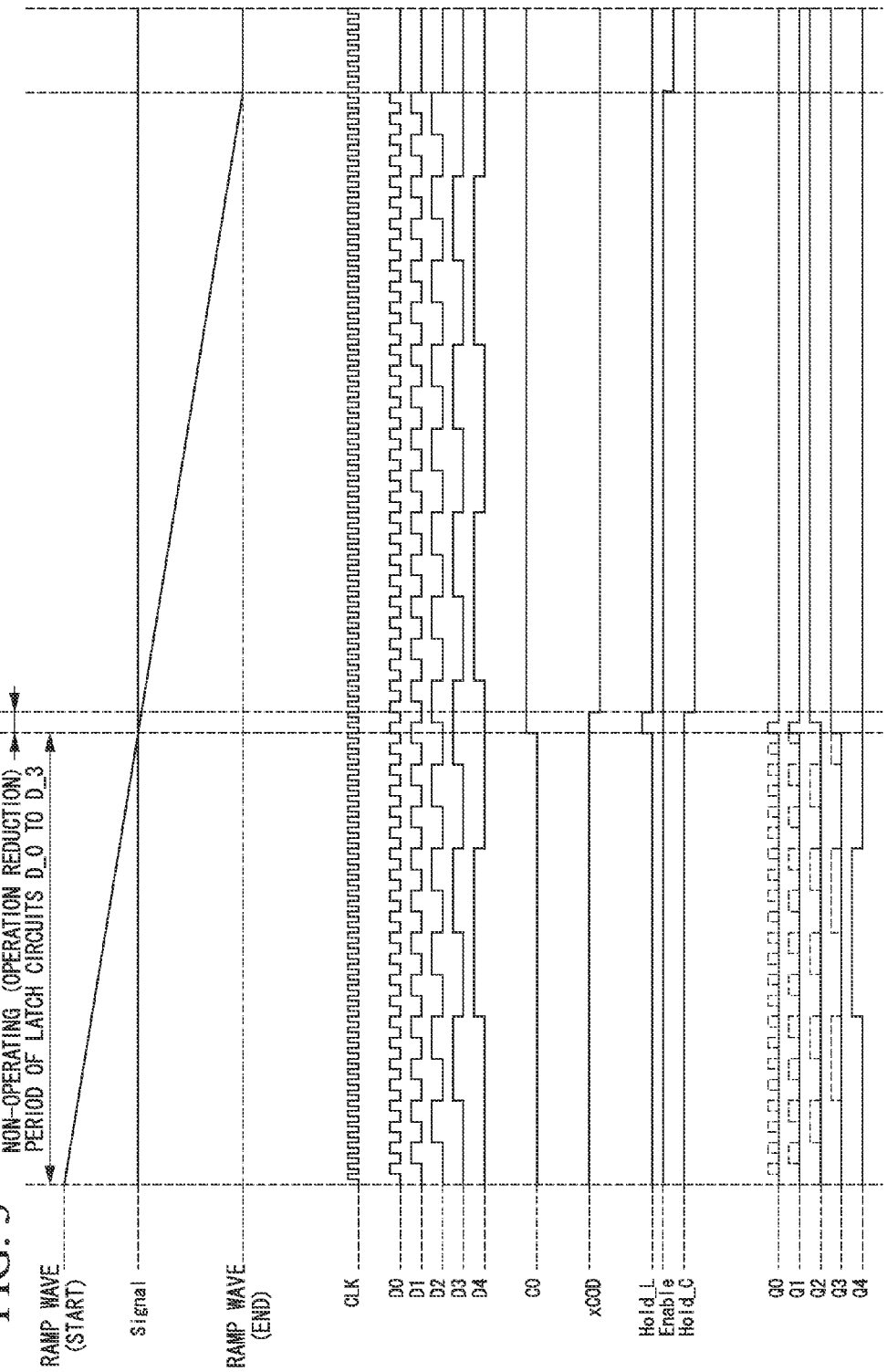
FIG. 3 is a timing diagram showing an operation of the AD conversion circuit according to the first embodiment of the present invention.

Next, an operation of the present embodiment will be described. FIG. 3 shows an operation of the AD conversion circuit. In FIG. 3, symbols D0 to D4 indicate count values of the first count section 18, and symbols Q0 to Q4 indicate outputs of the latch circuits D_0 to D_4 of the latch section 108. First, after the input of the analog signal Signal to be subjected to AD conversion has been stabilized, the ramp wave Ramp, which decreases with the passage of time, the ramp wave Ramp is provided to one input terminal of the comparison section 109. The comparison section 109 compares the ramp wave Ramp to the analog signal Signal.

Meanwhile, the first count section 18 counts a clock signal CLK, for example, in the count-up mode, and outputs the count values D0 to D4. In addition, the second count section 101 counts the output Q4 of the latch circuit D_4 of the latch section 108. Although it is preferable that the timing of a count operation start in the first count section 18 and the second count section 101 be approximately simultaneous with the timing of an output start of the ramp wave Ramp, the present invention is not limited thereto.

While a voltage of the ramp wave Ramp is greater than the voltage of the analog signal Signal, the comparison output CO of the comparison section 109 is low. Thus, the control signal Hold_L output from the AND circuit AND_0 of the latch control section 105 is low. Accordingly, the latch circuits D_0 to D_3 of the latch section 108 are in the disable state, and their operations are stopped.

On the other hand, because the delayed comparison output xCOD of the inverting delay circuit DLY of the latch control section 105 is high and the control signal Enable is high, the control signal Hold_C output from the AND circuit AND_1 of the latch control section 105 is high. Thus, the latch circuit D_4 of the latch section 108 is in the enable state, and directly outputs the count value D4 output from the first count section 18. The second count section 101 performs a count operation based on the output Q4 of the latch circuit D_4.

Subsequently, the comparison output CO is inverted when the voltage of the ramp wave Ramp has been approximately consistent with the voltage of the analog signal Signal (the first timing). Because the delayed comparison output xCOD of the inverting delay circuit DLY of the latch control section 105 is still high immediately after the comparison output CO has been inverted and the comparison output CO becomes high, the control signal Hold_L output from the AND circuit AND_0 of the latch control section 105 becomes high. Thereby, the latch circuits D_0 to D_3 of the latch section 108 are in the enable state.

Because the delayed comparison output xCOD becomes low when a time consistent with a delay time of the inverting delay circuit DLY of the latch control section 105 has elapsed from the first timing, the control signal Hold_L output from the AND circuit AND_0 of the latch control section 105 becomes low. Thereby, the latch circuits D_0 to D_3 of the latch section 108 are in the disable state, and latch the logical states corresponding to the count values D0 to D3 output from the first count section 18 (the second timing).

In addition, because the delayed comparison output xCOD becomes low, the control signal Hold_C output from the AND circuit AND_1 of the latch control section 105 becomes low. Thereby, the latch circuit D_4 of the latch section 108 is in the disable state and latches the logical state corresponding to the count value D4 output from the first count section 18 at the second timing. When the latch circuit D_4 of the latch section 108 is stopped (latched), the second count section 101 latches the count values D5 to D11 at that time.

Digital data DOUT[11:0] corresponding to the analog signal Signal is obtained according to count values latched by the latch circuits D_0 to D_4 of the latch section 108 and count values latched by the counter circuits C_5 to C_11 of the second count section 101. The obtained digital data DOUT [11:0] is output to a subsequent output section (not illustrated).

Because the latch circuits D_0 to D_3 are operable only in a period from the first timing to the second timing in the above-described operation, it is possible to reduce consumption current in the latch section 108. Accordingly, low consumption current of the AD conversion circuit is possible. In addition, when the first count section 18 includes, for example, a synchronous counter, it is possible to reduce a circuit scale as compared to the case in which only the first count section 18 performs a count operation as in a sixth embodiment to be described later if the second count section 101 includes for example, an asynchronous counter having a circuit scale smaller than that of the synchronous counter.

Although a configuration is made to implement low consumption current by controlling operations of the latch circuits D_0 to D_3 constituting the latch section 108 in the embodiment, a configuration may be made, for example, to control the latch circuits D_0 to D_2. In addition, the present invention is not limited thereto.

Second Embodiment

Figure 4:
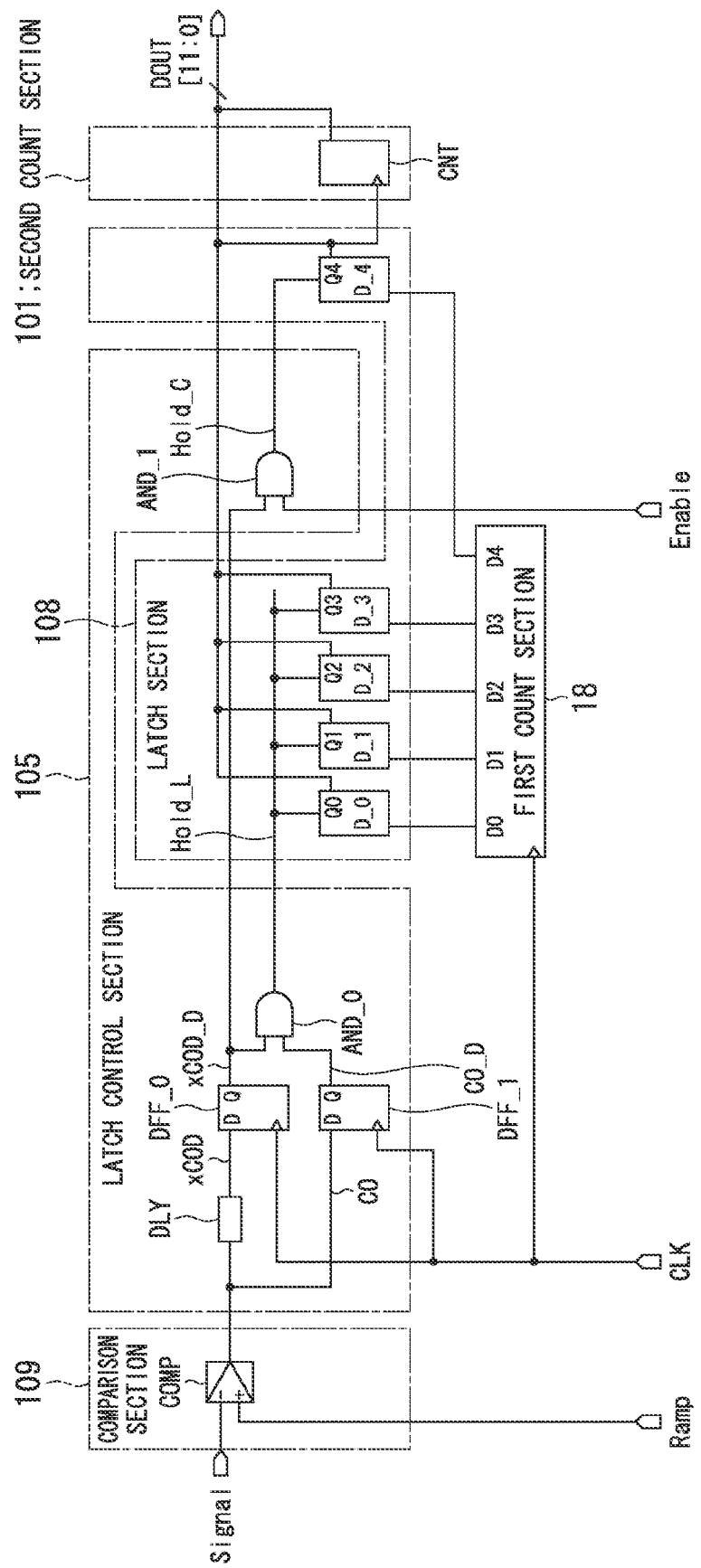
FIG. 4 is a circuit diagram showing a configuration of an AD conversion circuit according to a second embodiment of the present invention.

Next, the second embodiment of the present invention will be described. FIG. 4 shows an example of a configuration of an AD conversion circuit according to the present embodiment. Hereinafter, parts different from those of the first embodiment will mainly be described. In this embodiment, a configuration of a latch control section 105 is different from that of the first embodiment. Because configurations other than the latch control section 105 are the same as in the first embodiment, a description thereof is omitted here.

The latch control section 105 includes an inverting delay circuit DLY, AND circuit AND_0, AND circuit AND_1, flip-flop circuit DFF_0 and flip-flop circuit DFF_1. A comparison output CO from the comparison section 109 is input to the inverting delay circuit DLY. The inverting delay circuit DLY inverts and delays the input comparison output CO, and outputs a delayed comparison output xCOD.

The delayed comparison output xCOD from the inverting delay circuit DLY is input to the flip-flop circuit DFF_0. The flip-flop circuit DFF_0 outputs the delayed comparison output xCOD as a synchronized delayed comparison output xCOD_D in synchronization with a clock signal CLK. The comparison output CO from the comparison section 109 is input to the flip-flop circuit DFF_1. The flip-flop circuit DFF_1 outputs the comparison output CO as a synchronized comparison output CO_D in synchronization with the clock signal CLK.

The synchronized delayed comparison output xCOD_D from the flip-flop circuit DFF_0 and the synchronized comparison output CO_D from the flip-flop circuit DFF_1 are input to the AND circuit AND_0. The AND circuit AND_0 outputs a control signal Hold_L by carrying out a logical AND operation on the synchronized delayed comparison output xCOD_D and the synchronized comparison output CO_D. A control signal Enable and the synchronized delayed comparison output xCOD_D from the flip-flop circuit DFF_0 are input to the AND circuit AND_1. The AND circuit AND_1 outputs a control signal Hold_C by carrying out the logical AND operation on the control signal Enable and the synchronized delayed comparison output xCOD_D. Although the synchronized delayed comparison output xCOD_D and the synchronized comparison output CO_D are caused to be synchronized with the clock signal CLK in the present embodiment, the synchronized delayed comparison output xCOD_D and the synchronized comparison output CO_D may be caused to be synchronized with an inverted clock signal xCLK to which the clock signal CLK has been inverted.

Figure 5:
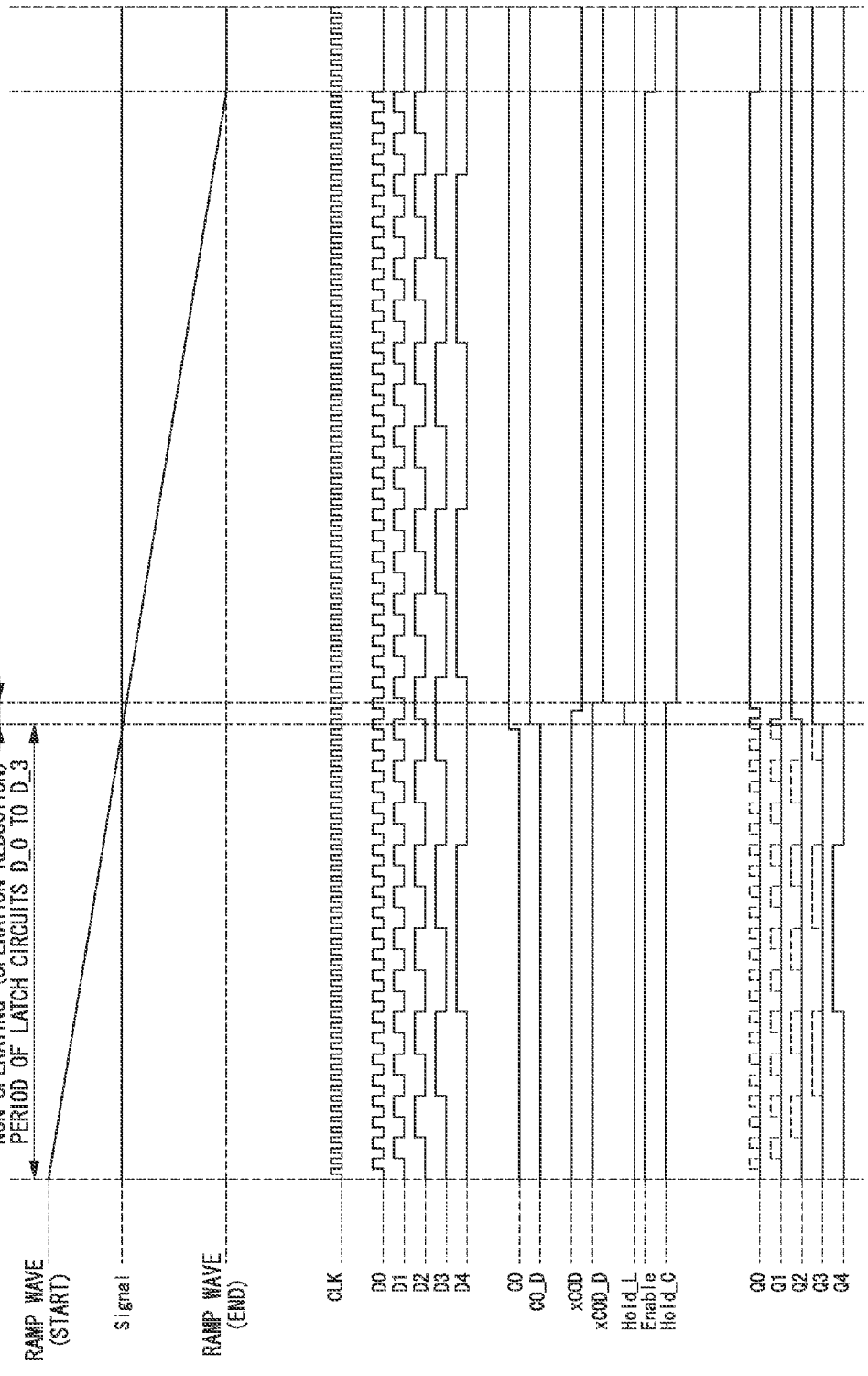
FIG. 5 is a timing chart showing an operation of the AD conversion circuit according to the second embodiment of the present invention.

Next, an operation of the present embodiment will be described. FIG. 5 shows an operation of the AD conversion circuit. In FIG. 5, symbols D0 to D4 indicate count values of the first count section 18, and symbols Q0 to Q4 indicate outputs of the latch circuits D_0 to D_4 of the latch section 108. First, after an input of an analog signal Signal to be subjected to AD conversion has been stabilized, a ramp wave Ramp, which decreases with the passage of time, is provided to one input terminal of the comparison section 109. The comparison section 109 compares the ramp wave Ramp to the analog signal Signal.

Meanwhile, the first count section 18 counts the clock signal CLK, for example, in the count-up mode, and outputs the count values D0 to D4. In addition, the second count section 101 counts the output Q4 of the latch circuit D_4 of the latch section 108. Although it is preferable that the timing of a count operation start in the first count section 18 and the second count section 101 be approximately simultaneous with the timing of an output start of the ramp wave Ramp, the present invention is not limited thereto.

While a voltage of the ramp wave Ramp is greater than a voltage of the analog signal Signal, the comparison output CO of the comparison section 109 is low. Because the comparison output CO is low, the synchronized comparison output CO_D of the flip-flop circuit DFF_1 of the latch control section 105 is low. Thus, the control signal Hold_L output from the AND circuit AND_0 of the latch control section 105 is low. Thereby, the latch circuits D_0 to D_3 of the latch section 108 are in the disable state, and their operations are stopped.

On the other hand, the delayed comparison output xCOD of the inverting delay circuit DLY of the latch control section 105 is high, and the synchronized delayed comparison output xCOD_D of the flip-flop circuit DFF_0 of the latch control section 105 is high. In addition, the control signal Enable is high. Thus, the control signal Hold_C output from the AND circuit AND_1 of the latch control section 105 is high. Thereby, the latch circuit D_4 of the latch section 108 is in the enable state, and directly outputs the count value D4 output from the first count section 18. The second count section 101 performs a count operation based on the output Q4 of the latch circuit D_4.

Subsequently, the comparison output CO is inverted when the voltage of the ramp wave Ramp has been approximately consistent with the voltage of the analog signal Signal. Because the comparison output CO becomes high, the synchronized comparison output CO_D of the flip-flop circuit DFF_1 of the latch control section 105 becomes high (a first timing). In addition, the delayed comparison output xCOD of the inverting delay circuit DLY of the latch control section 105 is still high immediately after the comparison output CO has been inverted, and the synchronized delayed comparison output xCOD_D of the flip-flop circuit DFF_0 of the latch control section 105 is still high. Thereby, because the control signal Hold_L output from the AND circuit AND_0 of the latch control section 105 becomes high, the latch circuits D_0 to D_3 of the latch section 108 are in the enable state.

When a time consistent with a sum of a delay time of the inverting delay circuit DLY of the latch control section 105 and a delay time of the flip-flop circuit DFF_0 has elapsed from the first timing, the synchronized delayed comparison output xCOD_D becomes low, so that the control signal Hold_L output from the AND circuit AND_0 of the latch control section 105 becomes low. Thereby, the latch circuits D_0 to D_3 of the latch section 108 are in the disable state, and latch logical states corresponding to the count values D0 to D3 output from the first count section 18 (a second timing).

In addition, because the synchronized delayed comparison output xCOD_D becomes low, the control signal Hold_C output from the AND circuit AND_1 of the latch control section 105 becomes low. Thereby, the latch circuit D_4 of the latch section 108 is in the disable state, and latches a logical state corresponding to the count value D4 output from the first count section 18 at the above-described second timing. The second count section 101 latches the count values D5 to D11 at that time when the latch circuit D_4 of the latch section 108 is stopped (latched).

Digital data DOUT[11:0] corresponding to the analog signal Signal is obtained according to count values latched by the latch circuits D_0 to D_4 of the latch section 108 and count values latched by the counter circuits C_5 to C_11 of the second count section 101. The obtained digital data DOUT [11:0] is output to a subsequent output section (not shown).

Because the latch circuits D_0 to D_3 are operable only in a period from the first timing to the second timing in the above-described operation, it is possible to reduce current consumption in the latch section 108. Accordingly, low consumption current of the AD conversion circuit is possible.

In addition, it is possible to cause the control signals Hold_L and Hold_C to be synchronized with the clock signal CLK and cause latch timings of the latch circuits D_0 to D_4 of the latch section 108 to be synchronized with the clock signal CLK by arranging the flip-flop circuits DFF_0 and DFF_1. Thus, when the latch circuits D_0 to D_4 of the latch section 108 latch the count values D0 to D4 output from the first count section 18 in synchronization with the clock signal CLK, it is possible to prevent the count values D0 to D4 from being latched in intermediate states (transition states) in which logical states are not fixed.

Third Embodiment

Figure 6:
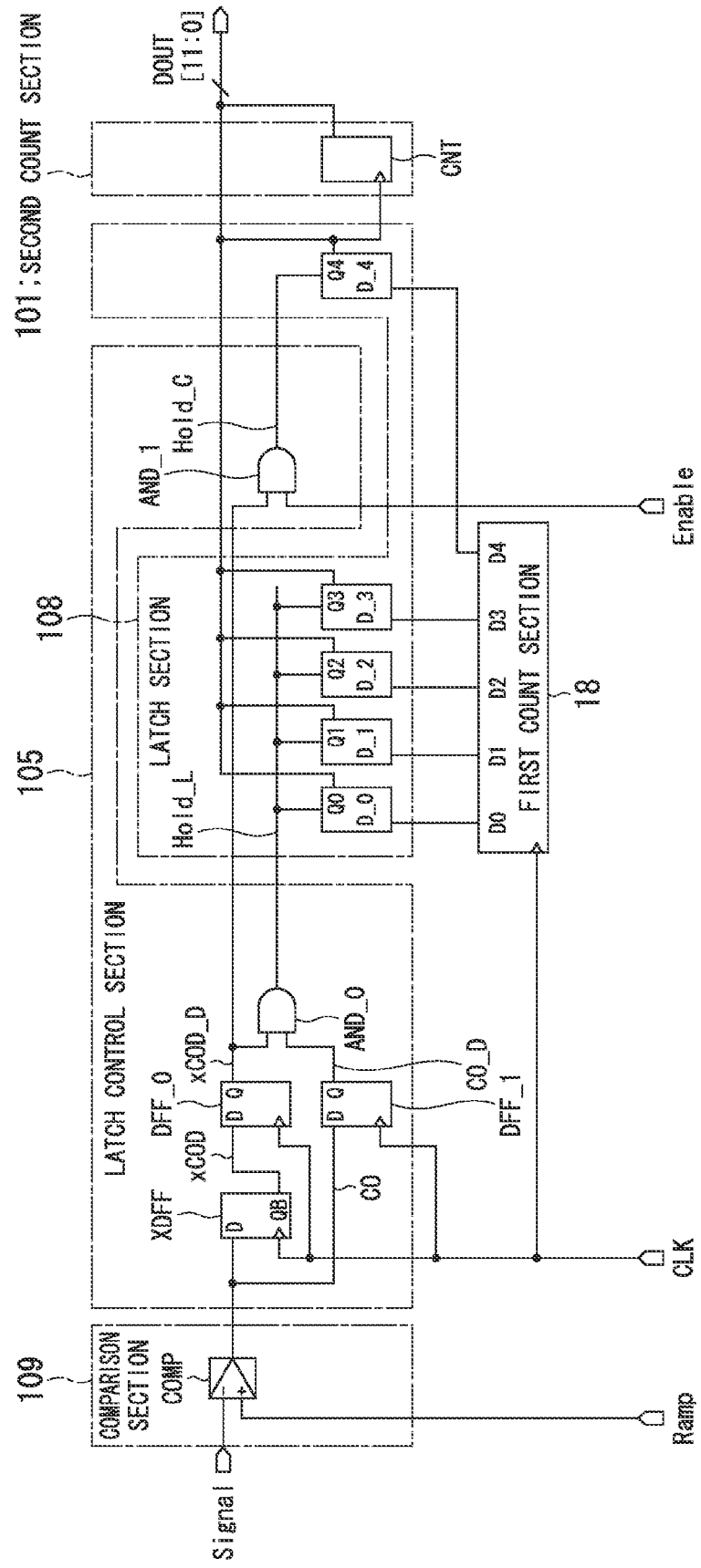
FIG. 6 is a circuit diagram showing a configuration of an AD conversion circuit according to a third embodiment of the present invention.

Next, the third embodiment of the present invention will be described. FIG. 6 shows an example of a configuration of an AD conversion circuit according to this embodiment. Hereinafter, parts different from those of the second embodiment will mainly be described. In this embodiment, a configuration of a latch control section 105 is different from that of the second embodiment. Because configurations other than the latch control section 105 are the same as in the second embodiment, a description thereof is omitted here.

The latch control section 105 includes AND circuit AND_0, AND circuit AND_1, flip-flop circuit DFF_0, flip-flop circuit DFF_1, and flip-flop circuit XDFF. A comparison output CO from the comparison section 109 is input to the flip-flop circuit XDFF. The flip-flop circuit XDFF inverts and delays the input comparison output CO, and outputs a delayed comparison output xCOD in synchronization with a clock signal CLK. Although the delayed comparison output xCOD is caused to be synchronized with the clock signal CLK in the present embodiment, a delayed comparison output xCOD may be caused to be synchronized with an inverted clock signal xCLK to which the clock signal CLK has been inverted.

Because elements of the latch control section 105 other than the flip-flop circuit XDFF are the same as in the second embodiment, description thereof is omitted. In addition, because the operation of the AD conversion circuit is the same as in the second embodiment except that the delayed comparison output xCOD is output in synchronization with the clock signal CLK, a description thereof is omitted here.

According to this embodiment, it is possible to reduce consumption current in the latch section 108 and implement low consumption current of the AD conversion circuit. In addition, it is possible to easily configure the latch control section 105 with only a digital circuit.

Fourth Embodiment

Figure 7:
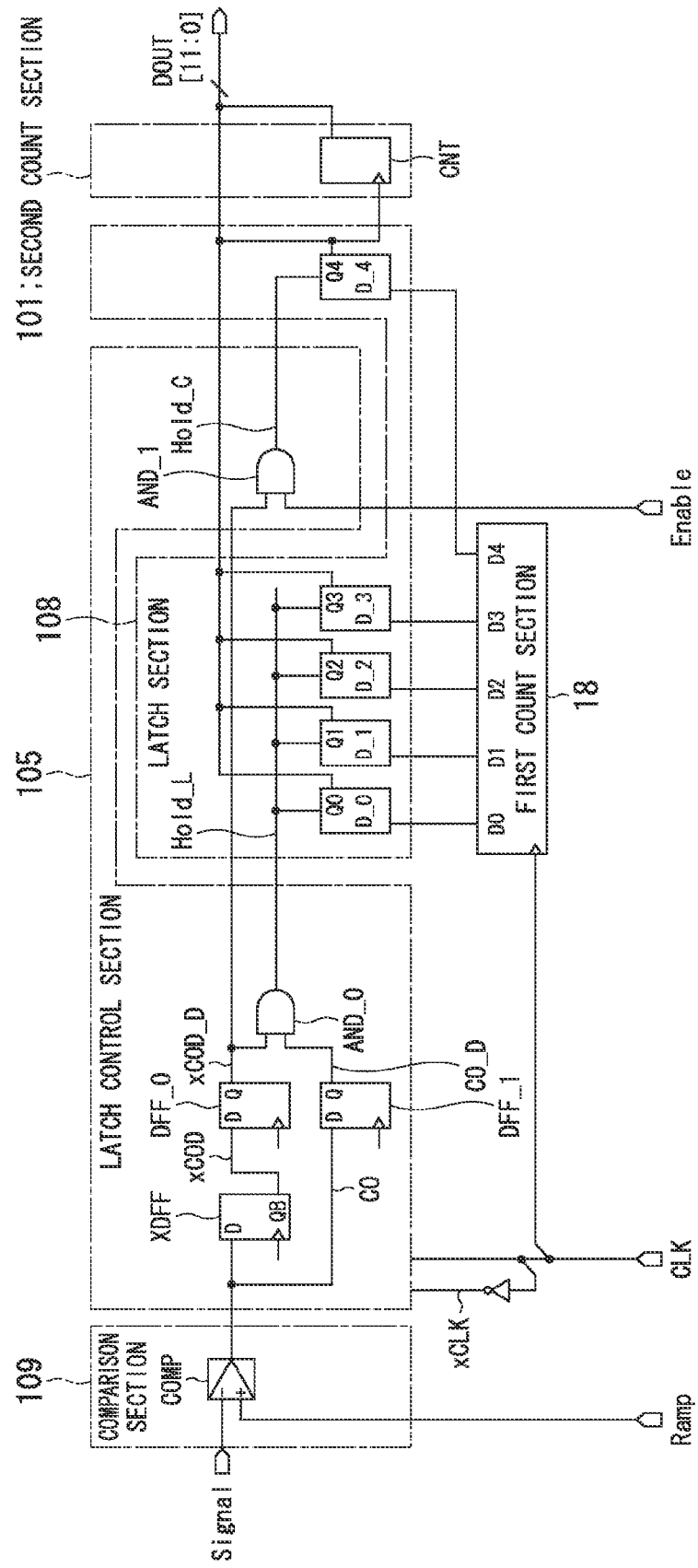
FIG. 7 is a circuit diagram showing a configuration of an AD conversion circuit according to a fourth embodiment of the present invention.

Next, the fourth embodiment of the present invention will be described. FIG. 7 shows an example of a configuration of an AD conversion circuit according to this embodiment. Hereinafter, parts different from those of the third embodiment will mainly be described. This embodiment is different from the third embodiment in that both a clock signal CLK and an inverted clock signal xCLK to which the clock signal CLK has been inverted are input to flip-flop circuits XDFF, DFF_0, and DFF_1 of a latch control section 105. Although only part of wirings of the clock signal CLK and the inverted clock signal xCLK within the latch control section 105 is shown in FIG. 7, both the clock signal CLK and the inverted clock signal xCLK are input to the flip-flop circuits XDFF, DFF_0, and DFF_1 as described above.

Because a configuration of the latch control section 105 is the same as in the third embodiment except for the above-described difference, a description thereof is omitted here. In addition, because an operation of the AD conversion circuit is the same as in the third embodiment, a description thereof is omitted here.

According to this embodiment, it is possible to reduce consumption current in the latch section 108 and implement low consumption current of the AD conversion circuit. In addition, when the latch control section 105 requires the inverted clock signal xCLK in addition to the clock signal CLK, the latch control section 105 is configured as in the present embodiment. Accordingly, because it is not necessary to generate the inverted clock signal xCLK in the flip-flop circuits XDFF, DFF_0, and DFF_1 of the latch control section 105, it is possible to reduce a circuit scale of the latch control section 105.

Fifth Embodiment

Figure 8:
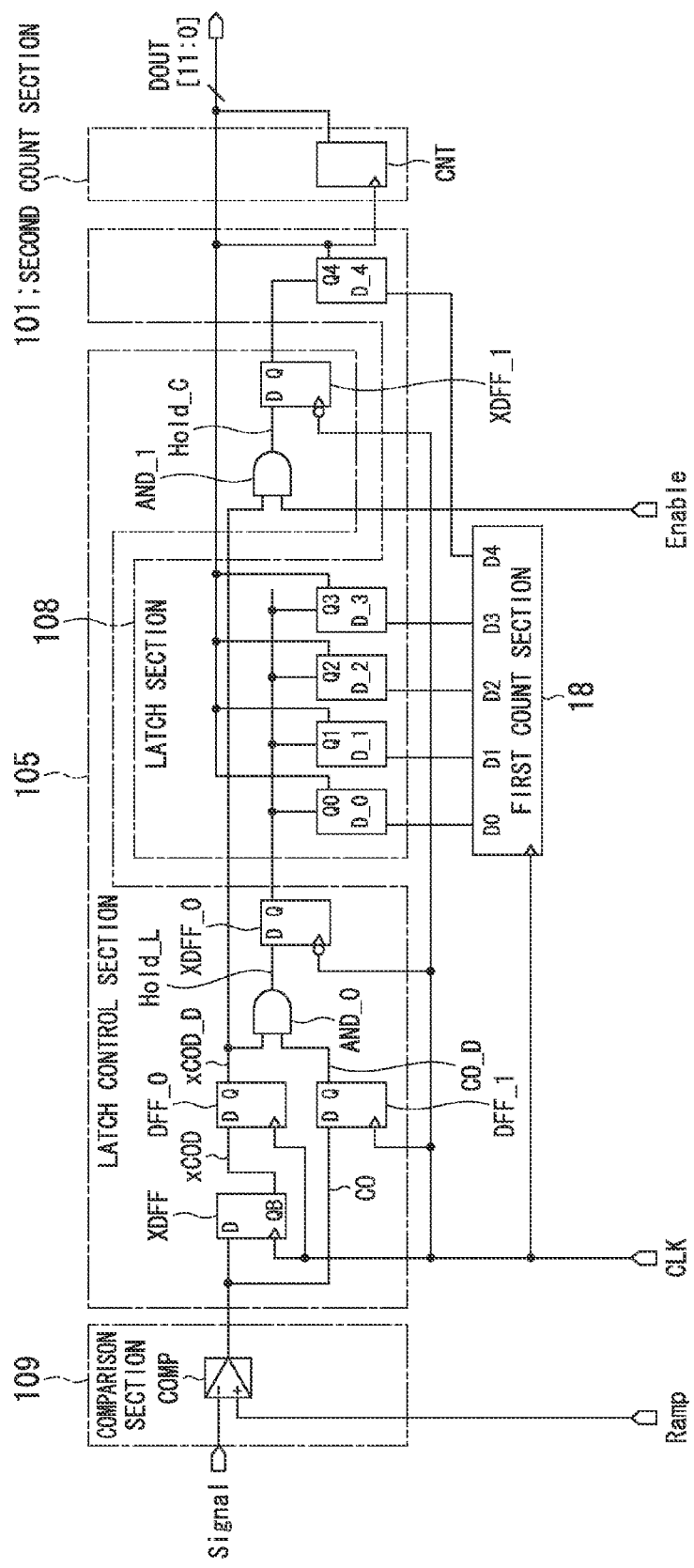
FIG. 8 is a circuit diagram showing a configuration of an AD conversion circuit according to a fifth embodiment of the present invention.

Next, the fifth embodiment of the present invention will be described. FIG. 8 shows an example of a configuration of an AD conversion circuit according to this embodiment. Hereinafter, parts different from those of the third embodiment will mainly be described. In this embodiment, a configuration of a latch control section 105 is different from that of the third embodiment. Because configurations other than the latch control section 105 are the same as in the third embodiment, a description thereof is omitted here.

The latch control section 105 includes AND circuit AND_0, AND circuit AND_1, flip-flop circuit DFF_0, flip-flop circuit DFF_1, flip-flop circuit XDFF, flip-flop circuit XDFF_0, and flip-flop circuit XDFF_1. A control signal Hold_L is input from the AND circuit AND_0 to the flip-flop circuit XDFF_0. The flip-flop circuit XDFF_0 causes the input control signal Hold_L to be delayed and output in synchronization with an inverted clock signal xCLK. In addition, a control signal Hold_C is input from the AND circuit AND_1 to the flip-flop circuit XDFF_1. The flip-flop circuit XDFF_1 causes the input control signal Hold_C to be delayed and output in synchronization with the inverted clock signal xCLK.

Because elements of the latch control section 105 other than the flip-flop circuits XDFF_0 and XDFF_1 are the same as in the third embodiment, a description thereof is omitted here. In addition, because an operation of the AD conversion circuit is the same as in the third embodiment except that the flip-flop circuit XDFF_0 of the latch control section 105 outputs the control signal Hold_L in synchronization with the inverted clock signal xCLK and the flip-flop circuit XDFF_1 of the latch control section 105 outputs the control signal Hold_C in synchronization with the inverted clock signal xCLK, a description thereof is omitted here.

According to this embodiment, consumption current can be reduced in the latch section 108, and low consumption current of the AD conversion circuit is possible. In addition, it is possible to cause the control signals Hold_L and Hold_C to be more reliably synchronized with the clock signal CLK and cause latch timings of the latch circuits D_0 to D_4 of the latch section 108 to be more reliably synchronized with the clock signal CLK by arranging the flip-flop circuits XDFF_0 and XDFF_1.

Although the present embodiment has been described on the basis of the configuration of the third embodiment, a change may be made to add the flip-flop circuits XDFF_0 and XDFF_1 to the latch control section 105 on the basis of the configuration of the second or fourth embodiment.

Sixth Embodiment

Figure 9:
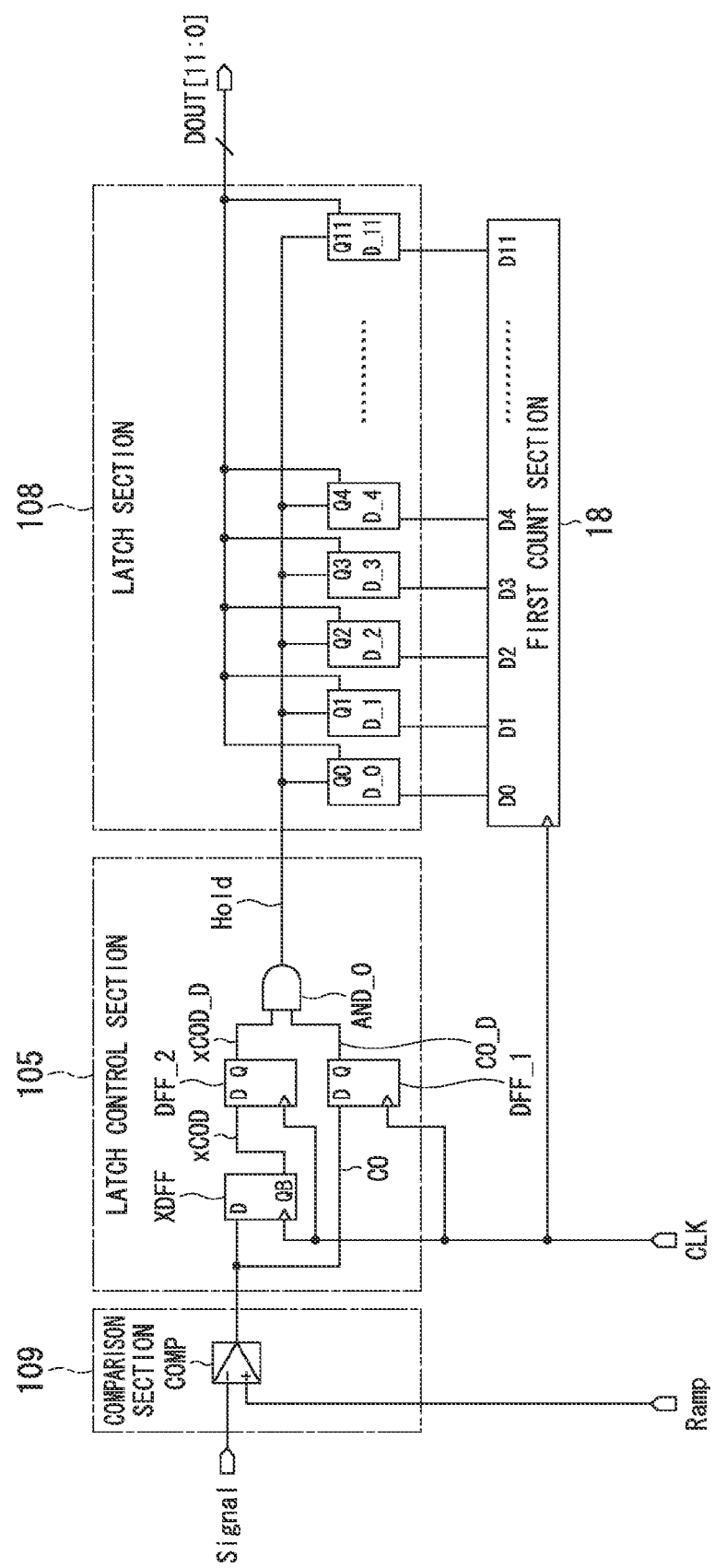
FIG. 9 is a circuit diagram showing a configuration of an AD conversion circuit according to a sixth embodiment of the present invention.

Next, the sixth embodiment of the present invention will be described. FIG. 9 shows an example of a configuration of an AD conversion circuit according to this embodiment. The AD conversion circuit shown in FIG. 9 includes a first count section 18, a latch control section 105, a latch section 108, and a comparison section 109. The comparison section 109 is the same as in the first embodiment.

The first count section 18 counts a clock signal CLK having a predetermined frequency as a count clock, and outputs binary count values D0 to D11. The first count section 18 includes counter circuits C_0 to C_4 of 5 bits in the first embodiment, but the first count section 18 includes counter circuits C_0 to C_11 of 12 bits to output the count values D0 to D11 in this embodiment. The latch section 108 has latch circuits D_0 to D_11 that latch logical states of the count values D0 to D11 output from the first count section 18.

The latch control section 105 includes an AND circuit AND_0, flip-flop circuit DFF_1, flip-flop circuit DFF_2, and flip-flop circuit XDFF. The flip-flop circuit DFF_2 is constituted, for example, by connecting four flip-flop circuits. In addition, each of the flip-flop circuits DFF_1 and XDFF is constituted by one flip-flop circuit. The AND circuit AND_0 is the same as in the first embodiment. The AND circuit AND_0 in this embodiment outputs a control signal Hold corresponding to the control signal Hold_L in the first embodiment.

Although details will be described later, the latch control section 105 enables the latch circuits D_0 to D_11 of the latch section 108 at a first timing at which a synchronized comparison output CO_D of the flip-flop circuit DFF_1 is inverted after a comparison output CO of the comparison section 109 has been inverted according to this configuration. Further, the latch control section 105 causes the latch circuits D_0 to D_11 of the latch section 108 to execute latch operations at a second timing delayed by a predetermined time from the first timing.

When the control signal Hold from the AND circuit AND_0 of the latch control section 105 is high, the latch circuits D_0 to D_11 of the latch section 108 are in the enable state and directly output the count values D0 to D11 from the first count section 18. In addition, the latch circuits D_0 to D_11 are in the disable state when the control signal Hold from the AND circuit AND_0 of the latch control section 105 transitions from the high level to the low level. At this time, the latch circuits D_0 to D_11 latch logical states corresponding to the count values D0 to D11 from the first count section 18.

The above-described configuration is an example, and it is possible to appropriately change the number of bits of a counter circuit constituting the first count section 18. In addition, although the flip-flop circuit DFF_2 includes the four flip-flop circuits and the flip-flop circuit DFF_1 includes the one flip-flop circuit in the present embodiment, the present invention is not limited to the above-described numbers of the flip-flop circuits.

Figure 10:
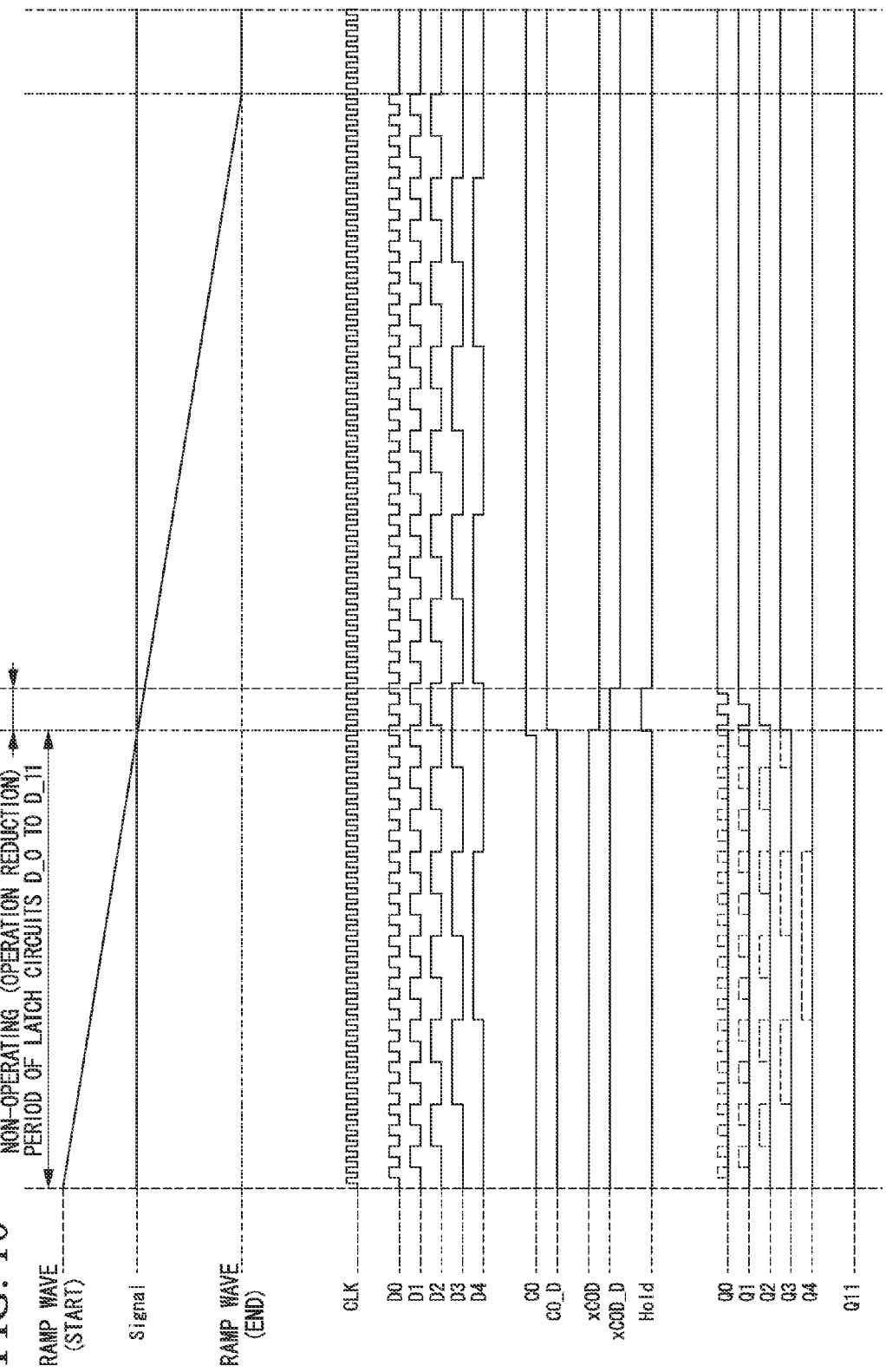
FIG. 10 is a timing chart showing an operation of the AD conversion circuit according to the sixth embodiment of the present invention.

Next, an operation of the present embodiment will be described. FIG. 10 shows an operation of the AD conversion circuit. In FIG. 10, symbols D0 to D4 indicate count values of the first count section 18, and symbols Q0 to Q4 and Q11 indicate outputs of the latch circuits D_0 to D_4 and D_11 of the latch section 108. First, after an input of an analog signal Signal to be subjected to AD conversion has been stabilized, a ramp wave Ramp, which decreases with the passage of time, is provided to one input terminal of the comparison section 109. The comparison section 109 compares the ramp wave Ramp to the analog signal Signal.

Meanwhile, the first count section 18 counts a clock signal CLK, for example, in the count-up mode, and outputs the count values D0 to D11. Although it is preferable that the timing of a count operation start in the first count section 18 be approximately simultaneous with the timing of an output start of the ramp wave Ramp, the present invention is not limited thereto.

While a voltage of the ramp wave Ramp is greater than a voltage of the analog signal Signal, the comparison output CO of the comparison section 109 is low. Because the comparison output CO is low, the synchronized comparison output CO_D of the flip-flop circuit DFF_1 of the latch control section 105 is low. Thus, the control signal Hold output from the AND circuit AND_0 of the latch control section 105 is low. Thereby, the latch circuits D_0 to D_11 of the latch section 108 are in the disable state, and their operations are stopped.

Subsequently, the comparison output CO is inverted when the voltage of the ramp wave Ramp has been approximately consistent with the voltage of the analog signal Signal. Because the comparison output CO becomes high, the synchronized comparison output CO_D of the flip-flop circuit DFF_1 of the latch control section 105 becomes high (the first timing). In addition, a delayed comparison output xCOD of the flip-flop circuit XDFF of the latch control section 105 is still high immediately after the comparison output CO has been inverted, and a synchronized delayed comparison output xCOD_D of the flip-flop circuit DFF_2 of the latch control section 105 is still high. Thereby, because the control signal Hold output from the AND circuit AND_0 of the latch control section 105 becomes high, the latch circuits D_0 to D_11 of the latch section 108 are in the enable state.

When a time consistent with a sum of a delay time of the flip-flop circuit XDFF of the latch control section 105 and a delay time of the flip-flop circuit DFF_2 has elapsed from the first timing, the synchronized delayed comparison output xCOD_D becomes low, so that the control signal Hold output from the AND circuit AND_0 of the latch control section 105 becomes low. Thereby, the latch circuits D_0 to D_11 of the latch section 108 are in the disable state, and latch logical states corresponding to the count values D0 to D11 output from the first count section 18 (the second timing).

Digital data DOUT[11:0] corresponding to the analog signal Signal is obtained according to count values latched by the latch circuits D_0 to D__11 of the latch section 108. The obtained digital data DOUT[11:0] is output to a subsequent output section (not shown).

Because the latch circuits D_0 to D_11 are operable only in a period from the first timing to the second timing in the above-described operation, it is possible to reduce consumption current in the latch section 108. Accordingly, low consumption current of the AD conversion circuit is possible.

In addition, it is possible to adjust a period in which the control signal Hold becomes high, that is, a period in which the latch circuits D_0 to D_11 of the latch section 108 are in the enable state, by adjusting the number of flip-flop circuits constituting the flip-flop circuit DFF_2. In this embodiment, the period in which the latch circuits D_0 to D_11 of the latch section 108 are in the enable state as shown in FIG. 10 is longer than the period in which the latch circuits D_0 to D_11 of the latch section 108 are in the enable state in FIG. 5.

The count values D0 to D11 output from the first count section 18 are delayed and input to the latch circuits D_0 to D_11 of the latch section 108. When the distance between the first count section 18 and the latch section 108 is greater, the count values D0 to D11 output from the first count section 18 are further delayed.

In the present embodiment, as described above, it is possible to delay latch timings of the latch circuits D_0 to D__11 in consideration of delays of the count values D0 to D11 input to the latch circuits D_0 to D_11 of the latch section 108 by further lengthening the period in which the latch circuits D_0 to D_11 of the latch section 108 are in the enable state.

The inverting delay circuit DLY may be used instead of the flip-flop circuit XDFF of the present embodiment. In addition, although the flip-flop circuit DFF_2 is constituted by four flip-flop circuits in the embodiment, the flip-flop circuit DFF_2 may be constituted by one flip-flop circuit if there is no need to delay the latch timings of the latch circuits D_0 to D_11. In addition, if there is no need to cause the latch timings of the latch circuits D_0 to D_11 to be in synchronization with the clock signal CLK, the flip-flop circuits DFF_1 and DFF_2 may not be provided. In addition, the flip-flop circuits XDFF_0 and XDFF_1 of FIG. 8 may be provided.

Seventh Embodiment

Figure 11:
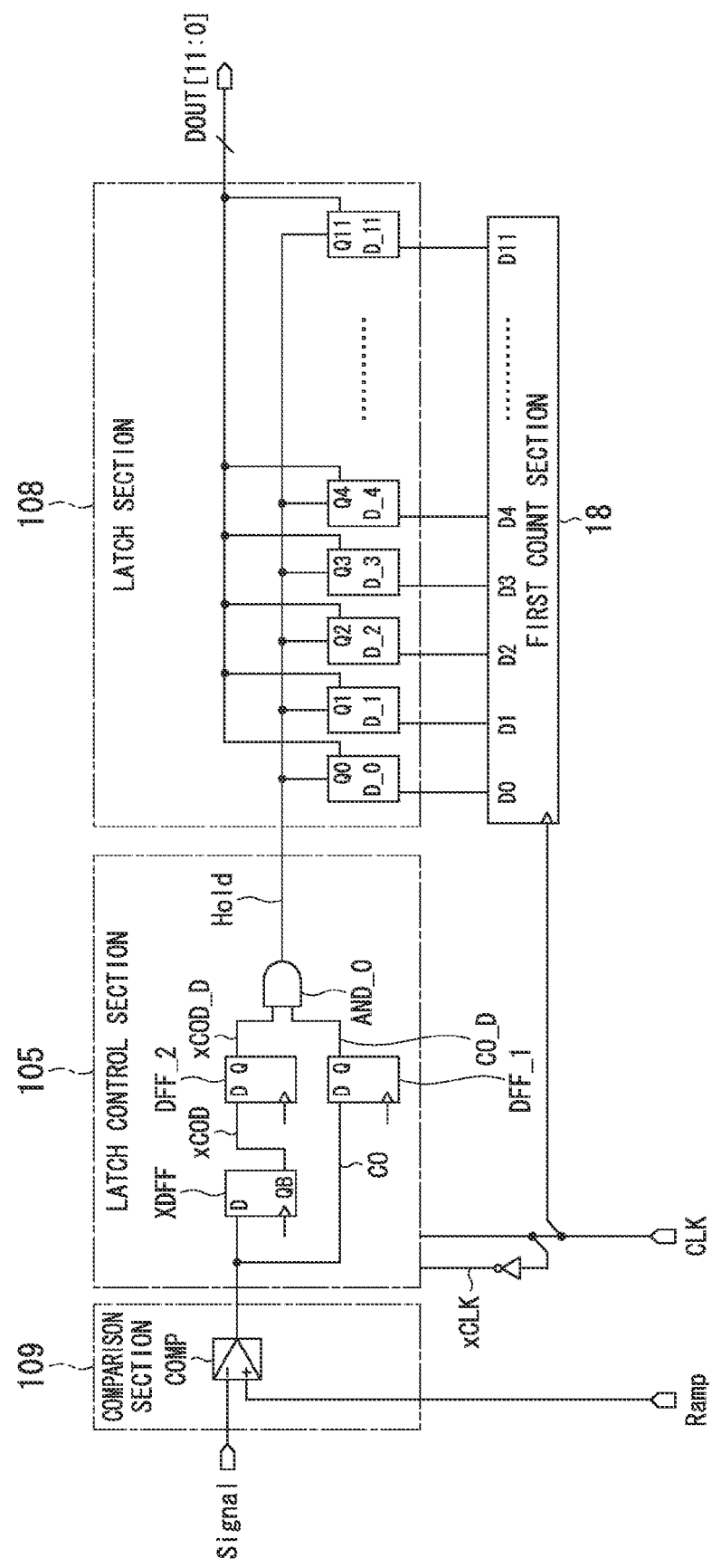
FIG. 11 is a circuit diagram showing a configuration of an AD conversion circuit according to a seventh embodiment of the present invention.

Next, the seventh embodiment of the present invention will be described. FIG. 11 shows an example of a configuration of an AD conversion circuit according to the embodiment. Hereinafter, parts different from those of the sixth embodiment will mainly be described. This embodiment is different from the sixth embodiment in that both a clock signal CLK and an inverted clock signal xCLK to which the clock signal CLK has been inverted are input to flip-flop circuits XDFF, DFF_1, and DFF_2 of a latch control section 105. Although only part of wirings of the clock signal CLK and the inverted clock signal xCLK within the latch control section 105 is shown in FIG. 11, both the clock signal CLK and the inverted clock signal xCLK are input to the flip-flop circuits XDFF, DFF_1, and DFF_2.

Because the configuration of the latch control section 105 is the same as in the sixth embodiment except for the above-described difference, a description thereof is omitted here. In addition, because the operation of the AD conversion circuit is the same as in the sixth embodiment, a description thereof is omitted here.

According to this embodiment, it is possible to reduce consumption current in the latch section 108 and implement low consumption current of the AD conversion circuit. In addition, when the latch control section 105 requires the inverted clock signal xCLK in addition to the clock signal CLK, the latch control section 105 is configured as in the embodiment. Accordingly, because it is not necessary to generate the inverted clock signal xCLK in the flip-flop circuits XDFF, DFF_1, and DFF_2 of the latch control section 105, it is possible to reduce the circuit scale of the latch control section 105.

Eighth Embodiment

Figure 12:
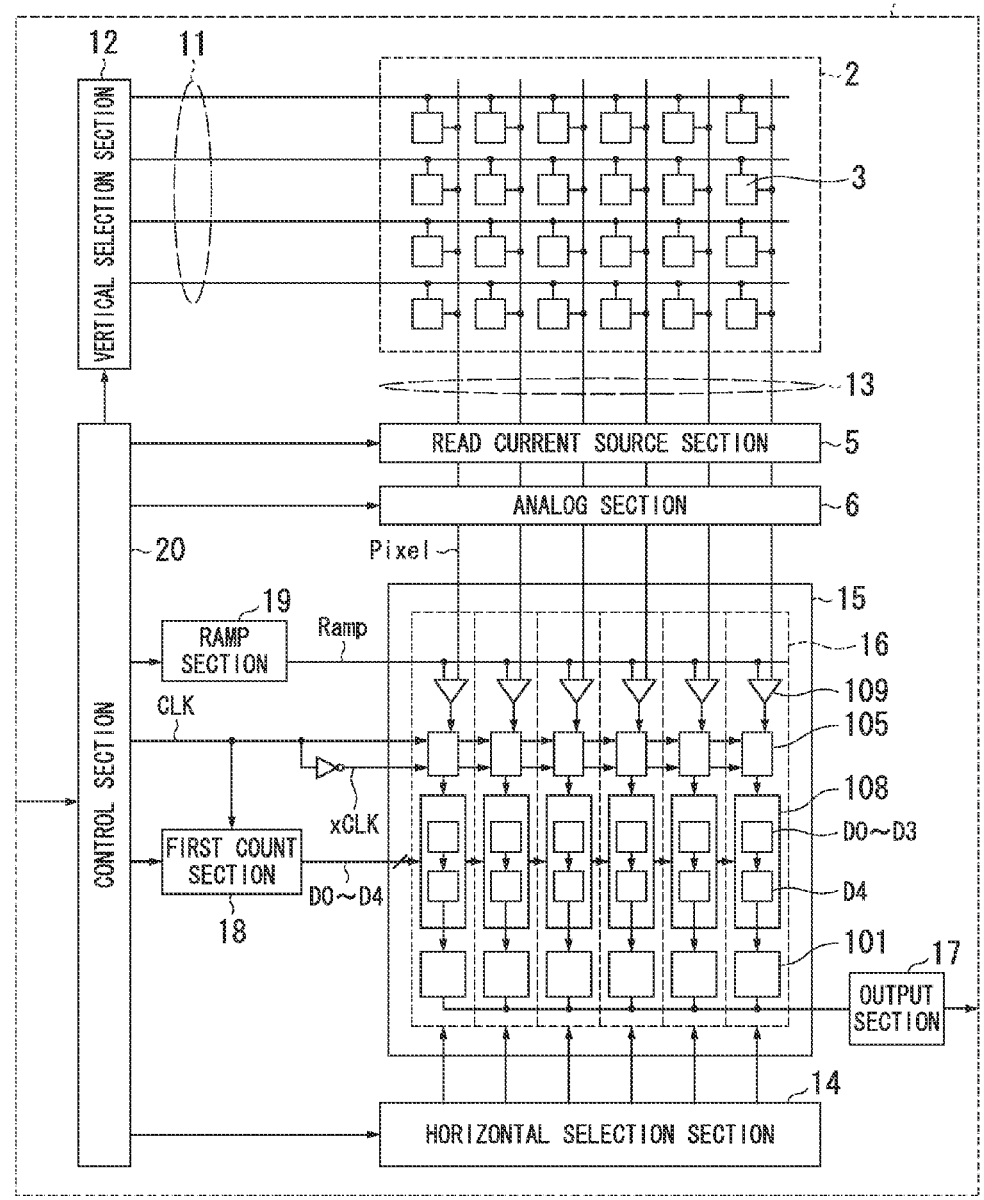
FIG. 12 is a block diagram showing a configuration of a solid-state imaging apparatus according to an eighth embodiment of the present invention.

Next, the eighth embodiment of the present invention will be described. FIG. 12 shows an example of a configuration of a solid-state imaging apparatus according to the present embodiment. The solid-state imaging apparatus 1 shown in FIG. 12 includes an imaging section 2, a vertical selection section 12, a read current source section 5, an analog section 6, a first count section 18, a ramp section 19 (reference signal generation section), a column processing section 15, a horizontal selection section 14, an output section 17, and a control section 20.

The imaging section 2 includes a plurality of unit pixels 3 arranged in a matrix for generating and outputting a signal corresponding to the amount of an incident electromagnetic wave. The vertical selection section 12 selects each row of the imaging section 2. The read current source section 5 reads a signal from the imaging section 2 as a voltage signal. Although details have not been described, the analog section 6 has an auto gain control (AGC) circuit having a signal amplification function if necessary. The first count section 18 performs a count operation by designating a clock signal CLK output from the control section 20 as a count clock, and outputs count values D0 to D4 indicating count results.

The ramp section 19 generates a ramp wave Ramp (a reference signal) that increases or decreases with the passage of time. The column processing section 15 is connected to the ramp section 19 via a reference signal line. The horizontal selection section 14 reads data subjected to AD conversion to a horizontal signal line. The output section 17 is connected to the horizontal signal line. The control section 20 controls each part.

Although the imaging section 2 including unit pixels of 4 rows×6 columns for simplicity has been described with reference to FIG. 12, several tens to several tens of thousands of unit pixels 3 are actually arranged in each row or column of the imaging section 2. Although not shown, the unit pixels 3 constituting the imaging section 2 include a photoelectric conversion element such as a photodiode/photogate/phototransistor and a transistor circuit.

Hereinafter, main parts will be described in further detail. In the imaging section 2, the unit pixels 3 are two-dimensionally arranged only in 4 rows and 6 columns, and a row control line 11 is wired for each row with respect to a pixel array of 4 rows and 6 columns. One end of the row control line 11 is connected to an output terminal corresponding to each row of the vertical selection section 12. The vertical selection section 12 includes a shift register or a decoder. The vertical selection section 12 controls row addressing or row scanning of the imaging section 2 via the row control line 11 when each unit pixel 3 of the imaging section 2 is driven. In addition, a vertical signal line 13 is wired for each column with respect to the pixel array of the imaging section 2.

The read current source section 5 includes, for example, an NMOS transistor. The vertical signal line 13 is connected from the imaging section 2 to a drain terminal of the NMOS transistor constituting the read current source section 5. A desired voltage is appropriately applied to a control terminal. A source terminal is connected to GND. Thereby, a signal from a pixel is output as a voltage mode. Although the case in which the NMOS transistor has been used as a current source has been described above, the present invention is not limited thereto.

The column processing section 15 has a column AD conversion section 16, for example, provided for each pixel column of the imaging section 2, that is, each vertical signal line 13. The column processing section 15 converts an analog pixel signal read from each unit pixel 3 of the imaging section 2 through the vertical signal line 13 for each pixel column into digital data. Although column AD conversion sections 16 are arranged to have a one-to-one correspondence relationship with pixel columns of the imaging section 2 in this embodiment, this is only an example and the present invention is not limited to this layout relationship. For example, one column AD conversion section 16 for a plurality of pixel columns can be arranged and the one column AD conversion section 16 can configured to be used and configured in time division among a plurality of pixel columns. The column processing section 15 is an AD conversion means for converting an analog pixel signal read from a unit pixel 3 of a selected pixel row of the imaging section 2 into digital pixel data along with the ramp section 19 and the first count section 18 as will be described later. Details of the column AD conversion section 16 will be described later.

The ramp section 19 includes, for example, an integrating circuit. According to control of the control section 20, the ramp section 19 generates a ramp wave Ramp, the level of which changes along a gradient with the passage of time, and supplies the ramp wave Ramp to one of input terminals of a comparison section 109 via a reference signal line. The ramp section 19 is not limited to the integrating circuit, and a digital-to-analog converter (DAC) circuit may be used. However, in the case of a configuration in which a ramp wave is digitally generated using the DAC circuit, a configuration that makes the step of the ramp wave fine or a configuration equivalent thereto is necessary.

The horizontal selection section 14 includes a shift register or a decoder. The horizontal selection section 14 controls column addressing or column scanning of the column AD conversion section 16 of the column processing section 15. According to control of the horizontal selection section 14, digital data subjected to AD conversion by the column AD conversion section 16 is sequentially read to the horizontal signal line.

The first count section 18 includes, for example, an up-counter circuit, to perform a count operation and output the count values D0 to D4. Although the first count section 18 may be constituted by a down-counter circuit, the present invention is not limited thereto. Further, although it is preferable that a synchronous counter circuit be used as a counter circuit constituting the first count section 18, the present invention is not limited thereto.

The output section 17 performs a subtraction operation (CDS process). The output section 17 may further have embedded signal processing functions, for example, such as black level adjustment, column variation correction, color processing, and the like. Further, n-bit parallel digital data may be converted into serial data and the serial data may be output.

The control section 20 includes a functional block of a timing generator (TG), which supplies predetermined timing pulse signals or clocks necessary for operations of parts such as the ramp section 19, the first count section 18, the vertical selection section 12, the horizontal selection section 14, and the output section 17, and a functional block for communicating with the TG.

Next, a configuration of the column AD conversion section 16 will be described. The column AD conversion section 16 generates a time interval having the magnitude (pulse width) of a time axis direction corresponding to each magnitude of the reset level (reference level) or the signal level by comparing an analog pixel signal Pixel read from each unit pixel 3 of the imaging section 2 via the vertical signal line 13 to a ramp wave Ramp for AD conversion provided from the ramp section 19. The AD conversion is performed by generating digital data according to the magnitude of a pixel signal Pixel from data corresponding to the time interval.

Hereinafter, details of a configuration of the column AD conversion section 16 will be described. The column AD conversion section 16 is provided for each column and six column AD conversion sections 16 are provided in FIG. 12. The column AD conversion sections 16 of the columns have the same configuration. The column AD conversion section 16 includes a comparison section 109, a latch control section 105, a latch section 108, and a second count section 101. The comparison section 109, the latch control section 105, the latch section 108, and the second count section 101 shown in FIG. 12 correspond to the comparison section 109, the latch control section 105, the latch section 108, and the second count section 101 shown in FIG. 7, respectively. The ramp section 19, the first count section 18, and the column AD conversion section 16 shown in FIG. 12 are an example of the AD conversion circuit of the embodiment.

As shown in FIG. 7, the analog signal Signal is input to one input terminal of the comparison section 109. An analog pixel signal Pixel output from a unit pixel 3 of the imaging section 2 via the vertical signal line 13 is input to the one input terminal of the comparison section 109 of the embodiment as the analog signal Signal.

The comparison section 109 converts the magnitude of the pixel signal into a time interval (pulse width), which is information of a time axis direction, by comparing a signal voltage corresponding to the pixel signal Pixel to a ramp voltage of the ramp wave Ramp supplied from the ramp section 19. For example, a comparison output CO of the comparison section 109 has the low level when the ramp voltage is greater than the signal voltage, and has the high level when the ramp voltage is less than or equal to the signal voltage. Because the configurations of the latch control section 105, the latch section 108, and the second count section 101 are the same as those shown in FIG. 7, a description thereof is omitted here.

Next, an operation of the embodiment will be described. Although the description of a specific operation of the unit pixel 3 is omitted here, a reset level and a signal level are output from the unit pixel 3 as is well known.

The AD conversion is performed as follows. For example, the ramp voltage of the ramp wave Ramp, which falls with a predetermined slope, is compared to the signal voltage of the pixel signal Pixel. During a period from a point in time related to a start of the comparison process to a second timing subsequent to a first timing related to a point in time when the ramp voltage of the ramp wave Ramp has been consistent with the signal voltage of the pixel signal Pixel, the count values D0 to D4 of the first count section 18 and count values D5 to D11 of the second count section 101 are counted. Thereby, digital data corresponding to the pixel signal Pixel is obtained.

In the present embodiment, the above-described AD conversion is performed for each of the reset level and the signal level read from the unit pixel 3. More specifically, the AD conversion is performed by reading the reset level including noise of a pixel signal in a first read operation from each unit pixel 3 of a selected row of the imaging section 2, and then the AD conversion is performed by reading the signal level in a second read operation. Thereafter, digital data corresponding to a signal component is obtained by digitally carrying out a subtraction operation (CDS process) on the reset level and the signal level. In the first read operation, the AD conversion may be performed by reading the signal level. In the subsequent second read operation, the AD conversion may be performed by reading the reset level.

<AD Conversion Operation>

Hereinafter, a detailed operation of the AD conversion will be described. In the following description, the elements and signals shown in FIG. 7 are appropriately used as elements and signals within the latch control section 105. After a pixel signal Pixel output from the unit pixel 3 of an arbitrary pixel row to the vertical signal line 13 has been stabilized, the control section 20 supplies control data of ramp wave generation to the ramp section 19. The ramp section 19 receives the control data, and outputs a ramp wave Ramp, the waveform of which temporally changes in a ramp shape as a whole, as a comparison voltage to be provided to one input terminal of the comparison section 109. The comparison section 109 compares the ramp wave Ramp to the pixel signal Pixel.

Meanwhile, the first count section 18 counts a clock signal CLK, for example, in the count-up mode, and outputs count values D0 to D4. In addition, the second count section 101 counts an output Q4 of a latch circuit D_4 of the latch section 108. Although it is preferable that the timing of a count operation start in the first count section 18 and the second count section 101 be approximately simultaneous with the timing of an output start of the ramp wave Ramp, the present invention is not limited thereto.

While the voltage of the ramp wave Ramp is greater than the voltage of the pixel signal Pixel, the comparison output CO of the comparison section 109 is low. Because the comparison output CO is low, a synchronized comparison output CO_D of a flip-flop circuit DFF_1 of the latch control section 105 is low. Thus, a control signal Hold_L output from an AND circuit AND_0 of the latch control section 105 is low. Thereby, latch circuits D_0 to D_3 of the latch section 108 are in the disable state, and their operations are stopped.

On the other hand, a delayed comparison output xCOD of a flip-flop circuit XDFF of the latch control section 105 is high, and a synchronized delayed comparison output xCOD_D of a flip-flop circuit DFF_0 of the latch control section 105 is high. In addition, a control signal Enable is high. Thus, a control signal Hold_C output from an AND circuit AND_1 of the latch control section 105 is high. Thereby, the latch circuit D_4 of the latch section 108 is in the enable state, and directly outputs the count value D4 output from the first count section 18. The second count section 101 performs a count operation based on the output Q4 of the latch circuit D_4 of the latch section 108.

Subsequently, the comparison output CO is inverted when the voltage of the ramp wave Ramp has been approximately consistent with the voltage of the pixel signal Pixel. Because the comparison output CO becomes high, the synchronized comparison output CO_D of the flip-flop circuit DFF_1 of the latch control section 105 becomes high (the first timing). In addition, the delayed comparison output xCOD of the flip-flop circuit XDFF of the latch control section 105 is still high immediately after the comparison output CO has been inverted, and the synchronized delayed comparison output xCOD_D of the flip-flop circuit DFF_0 of the latch control section 105 is still high. Thereby, because the control signal Hold_L output from the AND circuit AND_0 of the latch control section 105 becomes high, the latch circuits D_0 to D_3 of the latch section 108 are in the enable state.

When a time consistent with a sum of a delay time of the flip-flop circuit XDFF of the latch control section 105 and a delay time of the flip-flop circuit DFF_0 has elapsed from the first timing, the synchronized delayed comparison output xCOD_D becomes low, so that the control signal Hold_L output from the AND circuit AND_0 of the latch control section 105 becomes low. Thereby, the latch circuits D_0 to D_3 of the latch section 108 are in the disable state, and latch logical states corresponding to the count values D0 to D3 output from the first count section 18 (the second timing).

In addition, because the synchronized delayed comparison output xCOD_D becomes low, the control signal Hold_C output from the AND circuit AND_1 of the latch control section 105 becomes low. Thereby, the latch circuit D_4 of the latch section 108 is in the disable state, and latches a logical state corresponding to the count value D4 output from the first count section 18 at the above-described second timing. The second count section 101 latches the count values D5 to D11 at that time when the latch circuit D_4 of the latch section 108 is stopped (latched).

Digital data corresponding to the pixel signal Pixel is obtained according to count values latched by the latch circuits D_0 to D_4 of the latch section 108 and count values latched by counter circuits C_5 to C_11 of the second count section 101. When a predetermined time has elapsed, the control section 20 stops the supply of control data to the ramp section 19 and the count operation of the first count section 18. Thereby, the ramp section 19 stops ramp wave generation.

Thereafter, digital data is output by the horizontal selection section 14 to the output section 17 via the horizontal signal line. The output section 17 obtains data for a difference between the reset level and the signal level by carrying out a subtraction operation (CDS process). A circuit for carrying out the subtraction operation (CDS process) may be embedded in the column section (column AD conversion section 16). In addition, the present invention is not limited thereto.

Because the latch circuits D_0 to D_3 are operable only in a period from the first timing to the second timing in the above-described operation, it is possible to reduce consumption current in the latch section 108. Accordingly, low consumption current of the solid-state imaging apparatus is possible.

Although the configuration of the latch control section 105 of the embodiment is the same as the configuration shown in FIG. 7 as described above, the configuration of the latch control section 105 of this embodiment may be the same as those shown in FIGS. 1, 4, 6, and 8. In addition, the present invention is not limited thereto.

Ninth Embodiment

Figure 13:
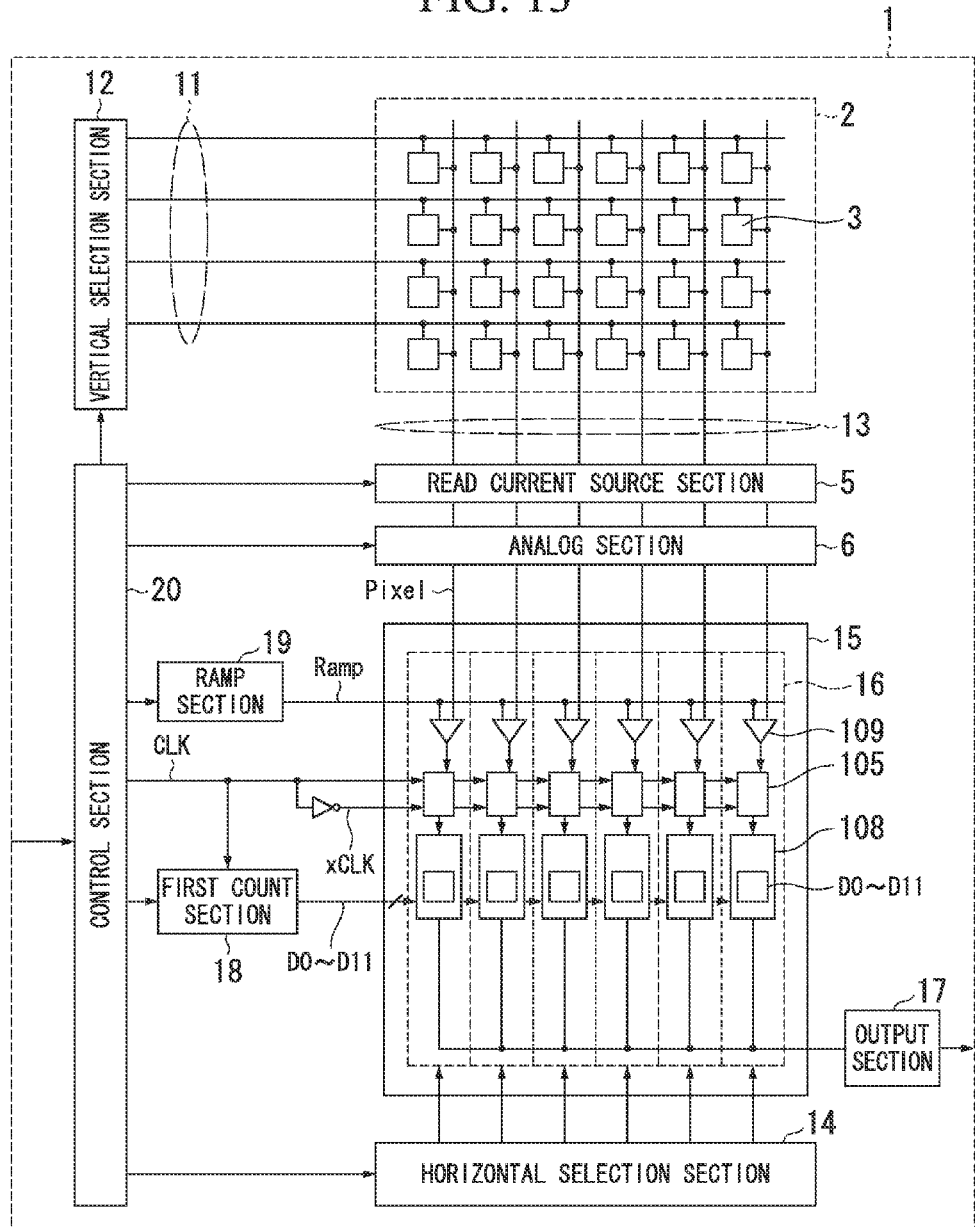
FIG. 13 is a block diagram showing a configuration of a solid-state imaging apparatus according to a ninth embodiment of the present invention.
Figure 14:
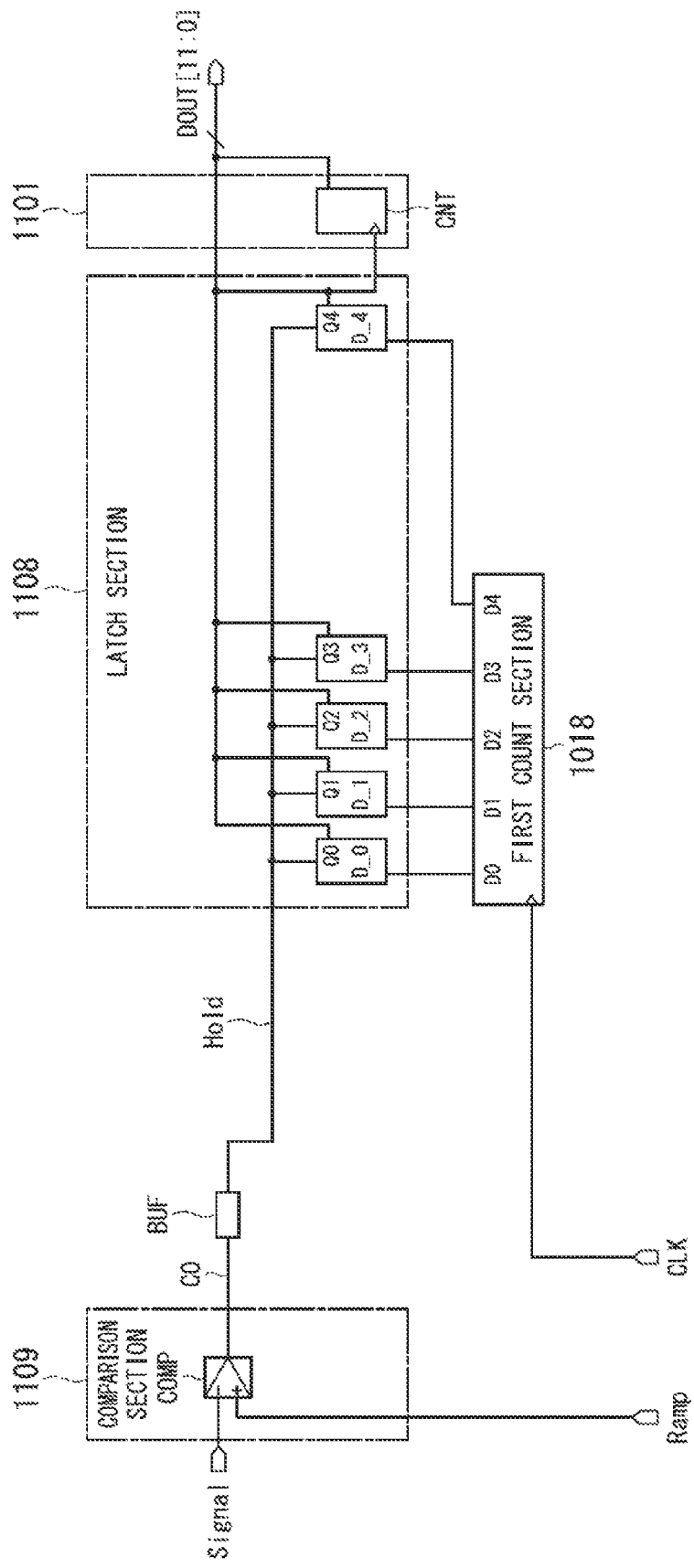
FIG. 14 is a circuit diagram showing a configuration of an AD conversion circuit of the related art.
Figure 15:
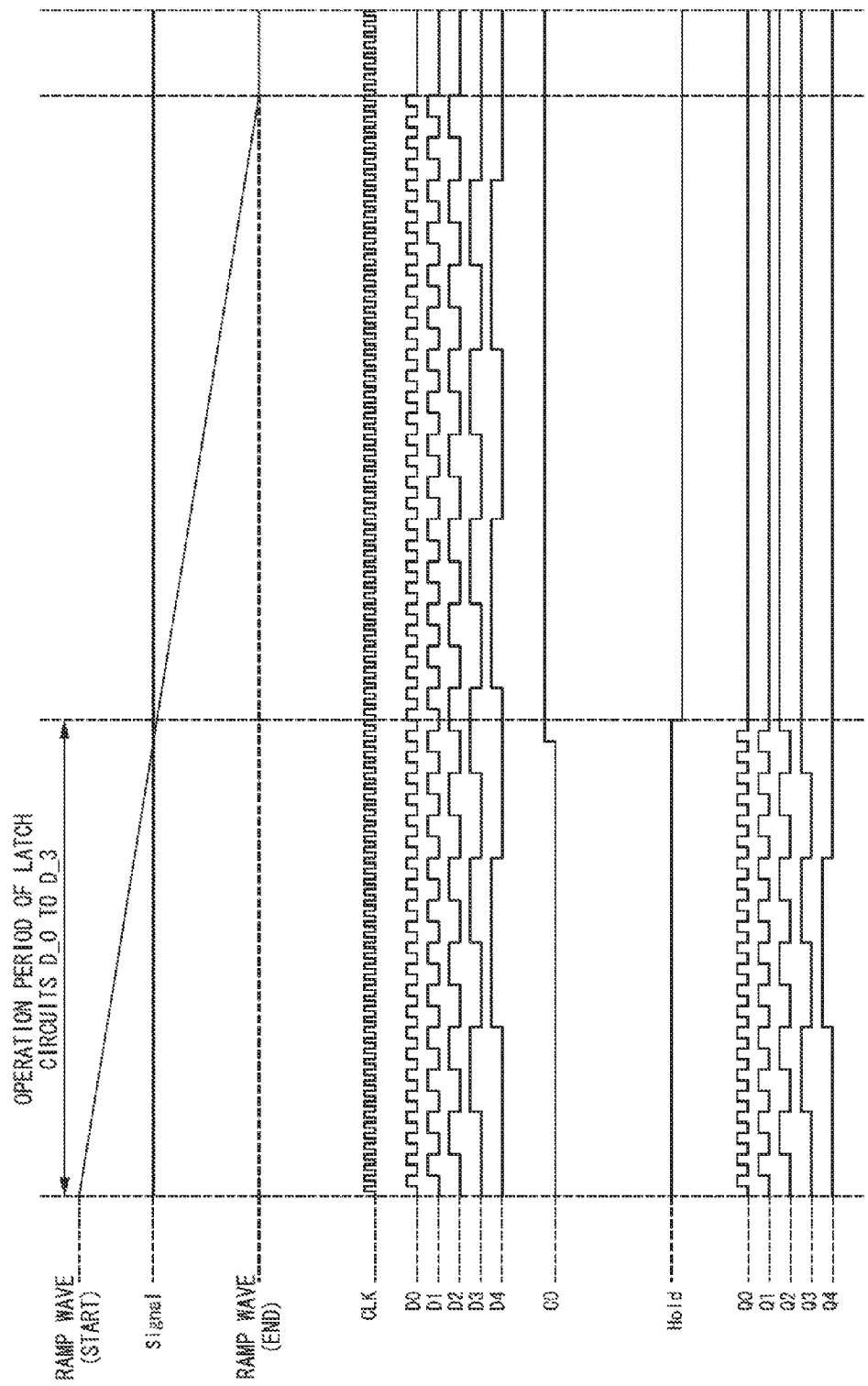
FIG. 15 is a timing chart showing an operation of the AD conversion circuit of the related art.

Next, the ninth embodiment of the present invention will be described. FIG. 13 shows an example of a configuration of a solid-state imaging apparatus according to the embodiment. Hereinafter, parts different from those of the eighth embodiment will mainly be described. In the embodiment, configurations of a first count section 18 and a column AD conversion section 16 are different from those of the eighth embodiment. Because configurations other than the first count section 18 and the column AD conversion section 16 are the same as in the eighth embodiment, a description thereof is omitted here.

The first count section 18 includes, for example, an up-counter circuit, to perform a count operation and output count values D0 to D11. Although the first count section 18 may be constituted by a down-counter circuit, the present invention is not limited thereto. Further, although it is preferable that a synchronous counter circuit be used as a counter circuit constituting the first count section 18, the present invention is not limited thereto.

The column AD conversion section 16 includes a comparison section 109, a latch control section 105, and a latch section 108. The comparison section 109, the latch control section 105, and the latch section 108 shown in FIG. 13 correspond to the comparison section 109, the latch control section 105, and the latch section 108 shown in FIG. 11, respectively. The ramp section 19, the first count section 18, and the column AD conversion section 16 shown in FIG. 13 are an example of the AD conversion circuit of the embodiment.

As in the eighth embodiment, an analog pixel signal Pixel output from a unit pixel 3 of the imaging section 2 via the vertical signal line 13 is input to one input terminal of the comparison section 109 of the embodiment as an analog signal Signal. Because configurations of the latch control section 105, the latch section 108, and the second count section 101 are the same as those shown in FIG. 11, a description thereof is omitted here.

Next, an operation of the embodiment will be described. As described above, a reset level and a signal level are output from the unit pixel 3.

The AD conversion is performed as follows. For example, a ramp voltage of a ramp wave Ramp, which falls with a predetermined slope, is compared to a signal voltage of a pixel signal Pixel. During a period from a point in time related to a start of the comparison process to a second timing subsequent to a first timing related to a point in time when the ramp voltage of the ramp wave Ramp has been consistent with the signal voltage of the pixel signal Pixel, count values D0 to D11 of the first count section 18 are measured. Thereby, digital data corresponding to the pixel signal Pixel is obtained.

In this embodiment, the above-described AD conversion is performed for each of the reset level and the signal level read from the unit pixel 3. More specifically, the AD conversion is performed by reading the reset level including noise of a pixel signal in a first read operation from each unit pixel 3 of a selected row of the imaging section 2. Subsequently, the AD conversion is performed by reading the signal level in a second read operation. Thereafter, digital data corresponding to a signal component is obtained by digitally carrying out a subtraction operation (CDS process) on the reset level and the signal level. In the first read operation, the AD conversion may be performed by reading the signal level. In the subsequent second read operation, the AD conversion may be performed by reading the reset level.

<AD Conversion Operation>

Hereinafter, a detailed operation of the AD conversion will be described. In the following description, the elements and signals shown in FIG. 11 are appropriately used as elements and signals within the latch control section 105. After a pixel signal Pixel output from the unit pixel 3 of an arbitrary pixel row to the vertical signal line 13 has been stabilized, the control section 20 supplies control data of ramp wave generation to the ramp section 19. The ramp section 19 receives the control data, and outputs a ramp wave Ramp, the waveform of which temporally changes in a ramp shape as a whole, as a comparison voltage to be provided to one input terminal of the comparison section 109. The comparison section 109 compares the ramp wave Ramp to the pixel signal Pixel.

Meanwhile, the first count section 18 counts a clock signal CLK, for example, in the count-up mode, and outputs count values D0 to D11. Although it is preferable that the timing of a count operation start in the first count section 18 be approximately simultaneous with the timing of an output start of the ramp wave Ramp, the present invention is not limited thereto.

While a voltage of the ramp wave Ramp is greater than a voltage of the pixel signal Pixel, a comparison output CO of the comparison section 109 is low. Because the comparison output CO is low, a synchronized comparison output CO_D of the flip-flop circuit DFF_1 of the latch control section 105 is low. Thus, a control signal Hold output from the AND circuit AND_0 of the latch control section 105 is low. Thereby, the latch circuits D_0 to D_11 of the latch section 108 are in the disable state, and their operations are stopped.

Subsequently, the comparison output CO is inverted when the voltage of the ramp wave Ramp has been approximately consistent with the voltage of the pixel signal Pixel. Because the comparison output CO becomes high, the synchronized comparison output CO_D of the flip-flop circuit DFF_1 of the latch control section 105 becomes high (the first timing). In addition, a delayed comparison output xCOD of the flip-flop circuit XDFF of the latch control section 105 is still high immediately after the comparison output CO has been inverted, and a synchronized delayed comparison output xCOD_D of the flip-flop circuit DFF_2 of the latch control section 105 is still high. Thereby, because the control signal Hold output from the AND circuit AND_0 of the latch control section 105 becomes high, the latch circuits D_0 to D_11 of the latch section 108 are in the enable state.

When a time consistent with a sum of a delay time of the flip-flop circuit XDFF of the latch control section 105 and a delay time of the flip-flop circuit DFF_2 has elapsed from the first timing, the synchronized delayed comparison output xCOD_D becomes low, so that the control signal Hold output from the AND circuit AND_0 of the latch control section 105 becomes low. Thereby, the latch circuits D_0 to D_11 of the latch section 108 are in the disable state, and latch logical states corresponding to the count values D0 to D11 output from the first count section 18 (the second timing).

Digital data corresponding to the pixel signal Pixel is obtained according to count values latched by the latch circuits D_0 to D_11 of the latch section 108. When a predetermined time has elapsed, the control section 20 stops the supply of control data to the ramp section 19 and the count operation of the first count section 18. Thereby, the ramp section 19 stops ramp wave generation.

Thereafter, digital data is output by the horizontal selection section 14 to the output section 17 via the horizontal signal line. The output section 17 obtains data for a difference between the reset level and the signal level by carrying out a subtraction operation (CDS process). A circuit for carrying out the subtraction operation (CDS process) may be embedded in the column section (column AD conversion section 16). In addition, the present invention is not limited thereto.

Because the latch circuits D_0 to D_11 are operable only in a period from the first timing to the second timing in the above-described operation, it is possible to reduce consumption current in the latch section 108. Accordingly, low consumption current of the solid-state imaging apparatus is possible.

Although the configuration of the latch control section 105 of the embodiment is the same as the configuration shown in FIG. 11 as described above, the configuration of the latch control section 105 of the embodiment may be the same as that shown in FIG. 9. In addition, the present invention is not limited thereto.

Although the embodiments of the present invention have been described above with reference to the drawings, specific configurations are not limited to these embodiments, and designs can also be made without departing from the scope of the present invention. Accordingly, the invention is not to be considered as being limited by the foregoing description, and is only limited by the scope of the appended claims.

The invention claimed is:

1. An analog-to-digital (AD) conversion circuit comprising:
    a reference signal generation section configured to generate a reference signal that increases or decreases with the passage of time;
    a comparison section configured to compare an analog signal to be subjected to AD conversion to the reference signal and configured to terminate a comparison process at a timing at which the reference signal has satisfied a predetermined condition for the analog signal;
    a first count section configured to count a clock signal of a predetermined frequency as a count clock and outputting a count value;
    a latch section configured to latch the count value output from the first count section; and
    a latch control section configured to enable the latch section at a first timing related to an end of the comparison process and configured to cause the latch section to execute a latch operation at a second timing delayed by a predetermined time from the first timing,
    wherein digital data corresponding to the analog signal is output on the basis of the count value latched in the latch section.

2. The AD conversion circuit according to claim 1, wherein the second timing is a timing synchronized with the clock signal.

3. A solid-state imaging apparatus comprising:
    an imaging section in which a plurality of pixels are each arranged in a matrix to output a pixel signal according to the amount of an incident electromagnetic wave; and
    the AD conversion circuit according to claim 1,
    wherein the pixel signal is input to the AD conversion circuit as the analog signal, and
    the comparison section, the latch section, and the latch control section are provided for every column or every plurality of columns of the image section.

4. An AD conversion circuit comprising:
    a reference signal generation section configured to generate a reference signal that increases or decreases with the passage of time;
    a comparison section configured to compare an analog signal to be subjected to AD conversion to the reference signal and configured to terminate a comparison process at a timing at which the reference signal has satisfied a predetermined condition for the analog signal;
    a first count section configured to count a clock signal of a predetermined frequency as a count clock and outputting a first count value;
    a latch section configured to latch the first count value output from the first count section;
    a second count section configured to count one of bits constituting the first count value output from the first count section as a count clock and latching a second count value; and
    a latch control section configured to enable the latch section at a first timing related to an end of the comparison process and configured to cause the latch section and the second count section to execute latch operations at a second timing delayed by a predetermined time from the first timing,
    wherein digital data corresponding to the analog signal is output on the basis of the first count value latched in the latch section and the second count value latched in the second count section.

5. A solid-state imaging apparatus comprising:
    an imaging section in which a plurality of pixels are each arranged in a matrix to output a pixel signal according to the amount of an incident electromagnetic wave; and
    the AD conversion circuit according to claim 4,
    wherein the pixel signal is input to the AD conversion circuit as the analog signal, and
    the comparison section, the latch section, the second count section, and the latch control section are provided for every column or every plurality of columns of the image section.

6. The AD conversion circuit according to claim 4, wherein the second timing is a timing synchronized with the clock signal.

* * * * *